(12) United States Patent
Guillorn et al.

(10) Patent No.: US 10,170,584 B2
(45) Date of Patent: Jan. 1, 2019

(54) NANOSHEET FIELD EFFECT TRANSISTORS WITH PARTIAL INSIDE SPACERS

(71) Applicant: INTERNATIONAL BUSINESS MACHINES CORPORATION, Armonk, NY (US)

(72) Inventors: Michael A. Guillorn, Cold Springs, NY (US); Terence B. Hook, Jericho, VT (US); Robert R. Robison, Colchester, VT (US); Reinaldo A. Vega, Mahopac, NY (US); Rajasekhar Venigalla, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/417,312

(22) Filed: Jan. 27, 2017

(65) Prior Publication Data

US 2018/0219082 A1    Aug. 2, 2018

(51) Int. Cl.
*H01L 29/66* (2006.01)
*H01L 21/28* (2006.01)
*H01L 29/06* (2006.01)
*H01L 29/423* (2006.01)
*H01L 29/49* (2006.01)
*H01L 29/786* (2006.01)

(52) U.S. Cl.
CPC .. *H01L 29/66553* (2013.01); *H01L 21/28088* (2013.01); *H01L 21/28194* (2013.01);
(Continued)

(58) Field of Classification Search
CPC ......... H01L 29/42392; H01L 29/66545; H01L 29/775; H01L 29/785; H01L 29/66795;
(Continued)

(56) References Cited

U.S. PATENT DOCUMENTS 7,354,839 B2   4/2008   Wei et al.
8,741,701 B2   6/2014   Cheng et al.
(Continued)

FOREIGN PATENT DOCUMENTS

KR   1020160019048 A   2/2016

OTHER PUBLICATIONS

Office Action with cited art in corresponding U.S. Appl. No. 15/797,648 dated May 14, 2018.

*Primary Examiner* — Khiem D Nguyen
(74) *Attorney, Agent, or Firm* — Tutunjian & Bitetto, P.C.; Vazken Alexanian

(57) ABSTRACT

A method of forming a nanosheet device, including forming a channel stack on a substrate, where the channel stack includes at least one nanosheet channel layer and at least one sacrificial release layer, forming a stack cover layer on at least a portion of the channel stack, forming a dummy gate on at least a portion of the stack cover layer, wherein at least a portion of the at least one nanosheet channel layer and at least one sacrificial release layer is exposed on opposite sides of the dummy gate, removing at least a portion of the at least one sacrificial release layer on each side of the dummy gate to form a sacrificial supporting rib, and forming an inner spacer layer on exposed portions of the at least one nanosheet channel layer and at least one sacrificial supporting rib.

14 Claims, 16 Drawing Sheets

(52) U.S. Cl.
CPC .... *H01L 29/0673* (2013.01); *H01L 29/42392* (2013.01); *H01L 29/4966* (2013.01); *H01L 29/66545* (2013.01); *H01L 29/66742* (2013.01); *H01L 29/78651* (2013.01); *H01L 29/78696* (2013.01)

(58) Field of Classification Search
CPC ......... H01L 21/30604; H01L 29/66553; H01L 29/78696
See application file for complete search history.

(56) References Cited

U.S. PATENT DOCUMENTS

| | | | |
|---|---|---|---|
| 8,766,353 B2 | 7/2014 | Doris et al. | |
| 9,287,357 B2 | 3/2016 | Rodder et al. | |
| 9,653,289 B1* | 5/2017 | Balakrishnan | H01L 27/088 |
| 9,666,693 B1* | 5/2017 | Doris | H01L 29/6681 |
| 9,805,988 B1* | 10/2017 | Bentley | H01L 21/82382 |
| 2014/0151639 A1* | 6/2014 | Chang | H01L 29/42392 257/27 |
| 2014/0339611 A1* | 11/2014 | Leobandung | H01L 29/78609 257/288 |
| 2015/0263091 A1* | 9/2015 | Hashemi | H01L 29/1008 257/191 |
| 2015/0364546 A1 | 12/2015 | Rodder et al. | |
| 2015/0372104 A1 | 12/2015 | Liu et al. | |
| 2015/0372111 A1 | 12/2015 | Koh et al. | |
| 2016/0049427 A1 | 2/2016 | Zang | |
| 2016/0071729 A1 | 3/2016 | Hatcher et al. | |
| 2017/0062598 A1* | 3/2017 | Seo | B82Y 10/00 |
| 2017/0250291 A1* | 8/2017 | Lee | H01L 29/78696 |

* cited by examiner

NANOSHEET FIELD EFFECT TRANSISTORS WITH PARTIAL INSIDE SPACERS

BACKGROUND

Technical Field

The present invention generally relates to formation of nanosheet field effect transistors (NSFETs) having a wraparound gate, and more particularly to the fabrication of NSFETs utilizing sacrificial layers with an inside spacer occupying a space between the source/drains and the gate.

Description of the Related Art

A Field Effect Transistor (FET) typically has a source, a channel, and a drain, where current flows from the source to the drain, and a gate that controls the flow of current through the channel. Field Effect Transistors (FETs) can have a variety of different structures, for example, FETs have been fabricated with the source, channel, and drain formed in the substrate material itself, where the current flows horizontally (i.e., in the plane of the substrate), and finFETs have been formed with the channel extending outward from the substrate, but where the current also flows horizontally from a source to a drain. The channel for the finFET can be an upright slab of thin rectangular Si, commonly referred to as the fin with a gate on the fin, as compared to a MOSFET with a single gate in the plane of the substrate. Depending on the doping of the source and drain, an n-FET or a p-FET can be formed.

Examples of FETs can include a metal-oxide-semiconductor field effect transistor (MOSFET) and an insulated-gate field-effect transistor (IGFET). Two FETs also can be coupled to form a complementary metal oxide semiconductor (CMOS) device, where a p-channel MOSFET and n-channel MOSFET are coupled together.

With ever decreasing device dimensions, forming the individual components and electrical contacts becomes more difficult. An approach is therefore needed that retains the positive aspects of traditional FET structures, while overcoming the scaling issues created by forming smaller device components.

SUMMARY

In accordance with an embodiment of the present invention, a method is provided for forming a nanosheet device. The method includes the step of forming a channel stack on a substrate, where the channel stack includes at least one nanosheet channel layer and at least one sacrificial release layer. The method further includes the step of forming a stack cover layer on at least a portion of the channel stack. The method further includes the step of forming a dummy gate on at least a portion of the stack cover layer, wherein at least a portion of the at least one nanosheet channel layer and at least one sacrificial release layer is exposed on opposite sides of the dummy gate. The method further includes the steps of removing at least a portion of the at least one sacrificial release layer on each side of the dummy gate to form a sacrificial supporting rib, and forming an inner spacer layer on exposed portions of the at least one nanosheet channel layer and at least one sacrificial supporting rib.

In accordance with another embodiment of the present invention, a method is provided for forming a nanosheet device. The method includes the step of forming a channel stack on a substrate, where the channel stack includes at least one nanosheet channel layer and at least one sacrificial release layer. The method further includes the step of forming a stack cover layer on at least a portion of the channel stack. The method further includes the step of forming a dummy gate on at least a portion of the stack cover layer, wherein at least a portion of the at least one nanosheet channel layer and at least one sacrificial release layer is exposed on opposite sides of the dummy gate. The method further includes the step of removing at least a portion of the at least one sacrificial release layer on each side of the dummy gate to form a sacrificial supporting rib. The method further includes the steps of forming an inner spacer layer on exposed portions of the at least one nanosheet channel layer and at least one sacrificial supporting rib, and removing the inner spacer layer, at least one nanosheet channel layer, and at least one sacrificial supporting rib from the opposite sides of the dummy gate to expose a portion of the substrate, wherein cavity fills remain under the dummy gate.

In accordance with yet another embodiment of the present invention, a nanosheet device is provided. The arrangement of the nanosheet device includes a gate structure on a substrate. The arrangement further includes a source/drain region on opposite sides of the gate structure. The arrangement further includes at least one nanosheet channel layer extending between the source/drain region on each of the opposite sides of the gate structure, wherein the at least one nanosheet channel layer is in physical and electrical contact with the source/drain region on each of the opposite sides of the gate structure. The arrangement further includes four cavity fills between the substrate and the at least one nanosheet channel layer, where one of the four cavity fills is located at each of the four corners of the at least one nanosheet channel layer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
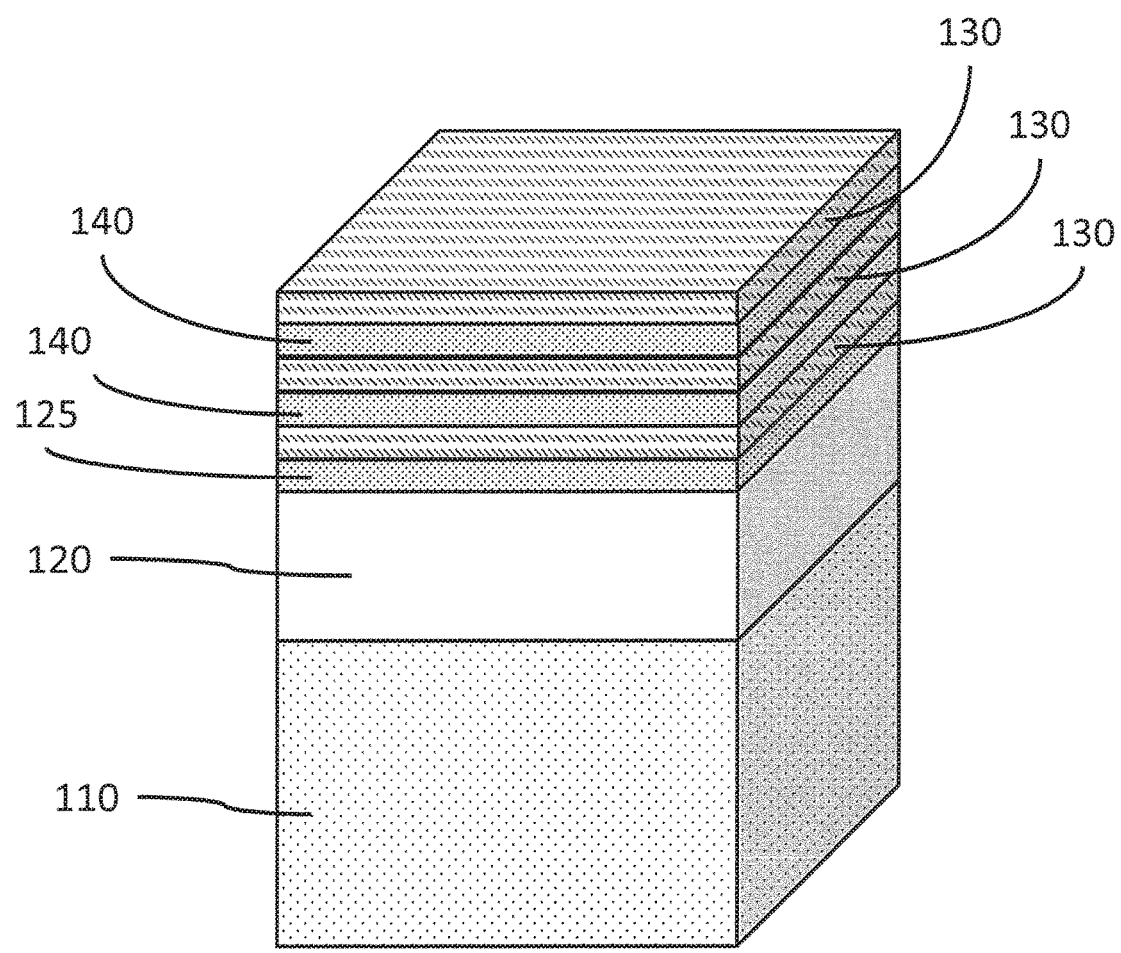
FIG. 1 is a cross-sectional perspective view of a channel layer stack including nanosheet channel layers and sacrificial release layers, in accordance with an embodiment of the present invention.

Principles and embodiments of the present disclosure relate generally to formation of nanosheet (NS) channels for a field effect transistor (FET) without significant lateral encroachment caused by an isotropic release etch. To mitigate the problem of lateral encroachment due to removal of the sacrificial release layers at the gate edge between the nanosheets, an inside spacer is utilized to protect the materials at the vulnerable positions.

Principles and embodiments of the present disclosure also relate generally to formation of a partial inside spacer prior to a release etch by removing a portion of the sacrificial release layers and replacing the sacrificial material with a protective spacer material at the exposed face of the channel stack.

Principles and embodiments of the present disclosure also relate generally to avoiding creation of multiple epitaxial growth fronts created by alternating epitaxial growth surfaces in the channel stack. The present principles and embodiments can also be directed to developing nanosheet (NS) channel strain with the embedded source/drain epitaxial growth.

Exemplary applications/uses to which the present principles can be applied include, but are not limited to: formation of complementary metal oxide silicon (CMOS) field effect transistors (FETs) formed by coupled finFETs, and digital gate devices (e.g., NAND, NOR, XOR, etc.).

In various embodiments, the materials and layers can be deposited by physical vapor deposition (PVD), chemical vapor deposition (CVD), atomic layer deposition (ALD), molecular beam epitaxy (MBE), or any of the various modifications thereof, for example, plasma-enhanced chemical vapor deposition (PECVD), metal-organic chemical vapor deposition (MOCVD), low pressure chemical vapor deposition (LPCVD), electron-beam physical vapor deposition (EB-PVD), and plasma-enhanced atomic layer deposition (PEALD). The depositions can be epitaxial processes, and the deposited material can be crystalline. In various embodiments, formation of a layer can be by one or more deposition processes, where, for example, a conformal layer may be formed by a first process (e.g., ALD, PEALD, etc.) and a fill may be formed by a second process (e.g., CVD, electrodeposition, PVD, etc.).

It is to be understood that the present invention will be described in terms of a given illustrative architecture; however, other architectures, structures, substrate materials and process features and steps may be varied within the scope of the present invention.

Reference to source/drain projections, layers, regions, etc., is intended to indicate that the particular device feature can be implemented as a source or a drain except as expressly indicated otherwise. In addition, the role of source and drain for an active device can in some instances be reversed, so a previously indicated drain may instead be a source and vice versa. Reference to a source/drain is, therefore, intended to encompass the broadest reasonable scope of the term.

It should be noted that certain features may not be shown in all figures for the sake of clarity. This is not intended to be interpreted as a limitation of any particular embodiment, or illustration, or scope of the claims.

Referring now to the drawings in which like numerals represent the same or similar elements and initially to FIG. 1, a cross-sectional perspective view of a channel layer stack including nanosheet channel layers and sacrificial release layers is shown, in accordance with an embodiment of the present invention.

In one or more embodiments, a substrate 110 can be a semiconductor or an insulator with an active surface semiconductor layer. The substrate can be crystalline, semi-crystalline, microcrystalline, or amorphous. The substrate can be essentially (i.e., except for contaminants) a single element (e.g., silicon), primarily (i.e., with doping) of a single element, for example, silicon (Si) or germanium (Ge), or the substrate can include a compound, for example, $Al_2O_3$, $SiO_2$, GaAs, SiC, or SiGe. The substrate can also have multiple material layers, for example, a semiconductor-on-insulator substrate (SeOI), a silicon-on-insulator substrate (SOI), germanium-on-insulator substrate (GeOI), or silicon-germanium-on-insulator substrate (SGOI), where an active surface layer 125 of the substrate 110 can be on a substrate insulator layer 120 (e.g., buried oxide layer (BOX)). The substrate can also have other layers forming the substrate, including high-k oxides and/or nitrides. In one or more embodiments, the substrate 110 can be a silicon wafer. In various embodiments, the substrate can be a single crystal silicon (Si), silicon germanium (SiGe), or III-V semiconductor (e.g., GaAs) wafer, or have a single crystal silicon (Si), silicon germanium (SiGe), or III-V semiconductor (e.g., GaAs) surface/active layer.

In one or more embodiments, a sacrificial release layer 130 can be formed on the surface of an active surface layer 125 of an SeOI substrate 110, where the active surface layer 125 is a semiconductor material. In one or more embodiments, a sacrificial release layer 130 can be formed on the surface of a semiconductor substrate 110, where the surface of the substrate 110 is a semiconductor material. The sacrificial release layers 130 can provide a gap for subsequent formation of at least a portion of a gate structure between the substrate and a nanosheet channel layer.

Figure 2:
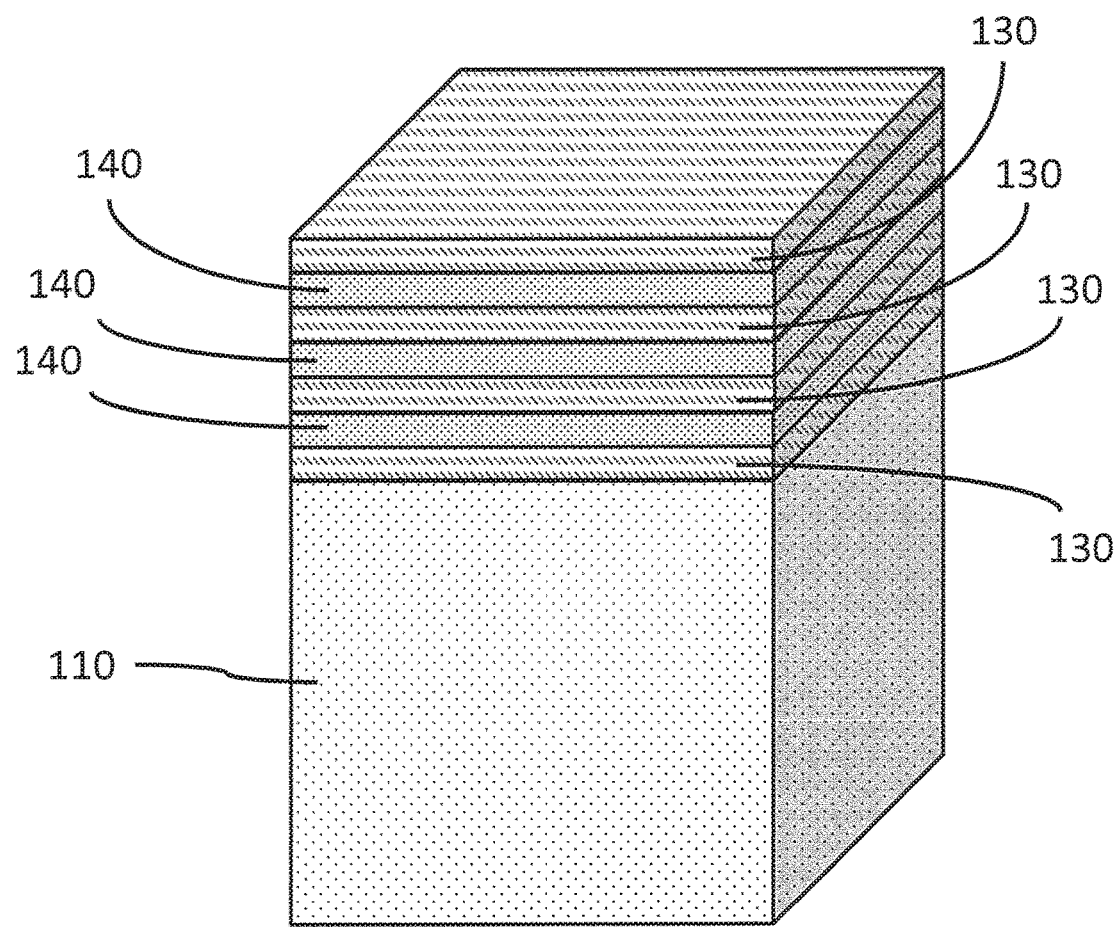
FIG. 2 is a cross-sectional perspective view of a channel layer stack including alternating nanosheet channel layers and sacrificial release layers on a single crystal wafer substrate, in accordance with an embodiment of the present invention.

In one or more embodiments, a plurality of sacrificial release layers 130 can be formed with alternating nanosheet channel layers 140 on a substrate 110, where the substrate 110 can be a semiconductor-on-insulator (SeOI) substrate with an active semiconductor surface layer 125 or a semiconductor substrate (e.g., single crystal silicon wafer), as shown in FIG. 2.

In various embodiments, the sacrificial release layers 130 can have a top surface, a bottom surface, and a thickness there between, where the sacrificial release layers 130 can be epitaxially grown on a surface of a crystalline material. The sacrificial release layers 130 can be a different material than the substrate material and/or the material of a nanosheet channel layer 140. The sacrificial release layers 130 can be heteroepitaxially deposited on an exposed crystalline surface, for example, on a crystalline nanosheet channel layer 140.

In one or more embodiments, the sacrificial release layers 130 can have a thickness in the range of about 5 nm to about 20 nm, or in the range of about 10 nm to about 15 nm, or about 10 nm, although other thicknesses are also contemplated.

In one or more embodiments, a sacrificial release layer 130 can be made of a material that can be selectively etched compared to the material of the nanosheet channel layer 140 and/or substrate 110 material. In a non-limiting exemplary embodiment, the sacrificial release layer 130 can be silicon-germanium ($Si_xGe_{1-x}$), where the germanium concentration can be about 50 at. % to about 70 at. %, or about 60 at. % (atomic percent).

In various embodiments, the nanosheet channel layer 140 can have a top surface, a bottom surface, and a thickness there between, where the nanosheet channel layer 140 can be epitaxially grown on a surface of a crystalline material. The nanosheet channel layer 140 can be a different material than the substrate material and/or the material of a sacrificial release layer 130. The nanosheet channel layer 140 can be heteroepitaxially deposited on an exposed crystalline surface, for example, on a crystalline sacrificial release layer 130. Additional nanosheet channel layer(s) 140 and sacrificial release layer(s) 130 can be alternately formed to provide a channel layer stack having N sacrificial release layers 130 and N−1 nanosheet channel layer(s) 140.

In one or more embodiments, the nanosheet channel layer 140 can have a thickness in the range of about 2 nm to about 10 nm, or in the range of about 3 nm to about 7 nm, or about 5 nm, although other thicknesses are also contemplated.

In one or more embodiments, a nanosheet channel layer 140 can be made of a material that can be selectively etched compared to the material of the sacrificial release layer 130. In various embodiments, the nanosheet channel layer 140 can be the same material as the substrate 110. In a non-limiting exemplary embodiment, the nanosheet channel layer 140 can be silicon.

FIG. 2 is a cross-sectional perspective view of a channel layer stack including alternating nanosheet channel layers and sacrificial release layers on a single crystal wafer substrate, in accordance with an embodiment of the present invention.

In one or more embodiments, a sacrificial release layer 130 can be formed on at least a portion of an exposed substrate surface, where the sacrificial release layer 130 can be epitaxially grown on a single crystal substrate 110 having a predetermined crystal orientation. The sacrificial release layer 130 can be a material that is different from the exposed substrate material, where the sacrificial release layer 130 can be heteroepitaxially grown on the substrate surface. The material of the sacrificial release layer 130 can be selected to reduce inherent strain in the epitaxially grown layer, and the thickness of the sacrificial release layer 130 can be kept below the critical thickness at which dislocations (e.g., threading dislocations) could appear.

In one or more embodiments, a nanosheet channel layer 140 can be formed on at least a portion of an exposed surface of a sacrificial release layer 130, where the nanosheet channel layer 140 can be epitaxially grown on a single crystal sacrificial release layer 130 having a predetermined crystal orientation. The nanosheet channel layer 140 can be a material that is different from the sacrificial release layer 130 material, where the nanosheet channel layer 140 can be heteroepitaxially grown on the surface of the sacrificial release layer 130. The material of the nanosheet channel layer 140 can be selected to reduce inherent strain in the epitaxially grown layer, and the thickness of the nanosheet channel layer 140 can be kept below the critical thickness at which dislocations could appear.

In one or more embodiments, N nanosheet channel layers 140 alternating with N or N+1 sacrificial release layers 130 can form a channel layer stack, where N can be a predetermined number of nanosheet channel layers 140.

Figure 3:
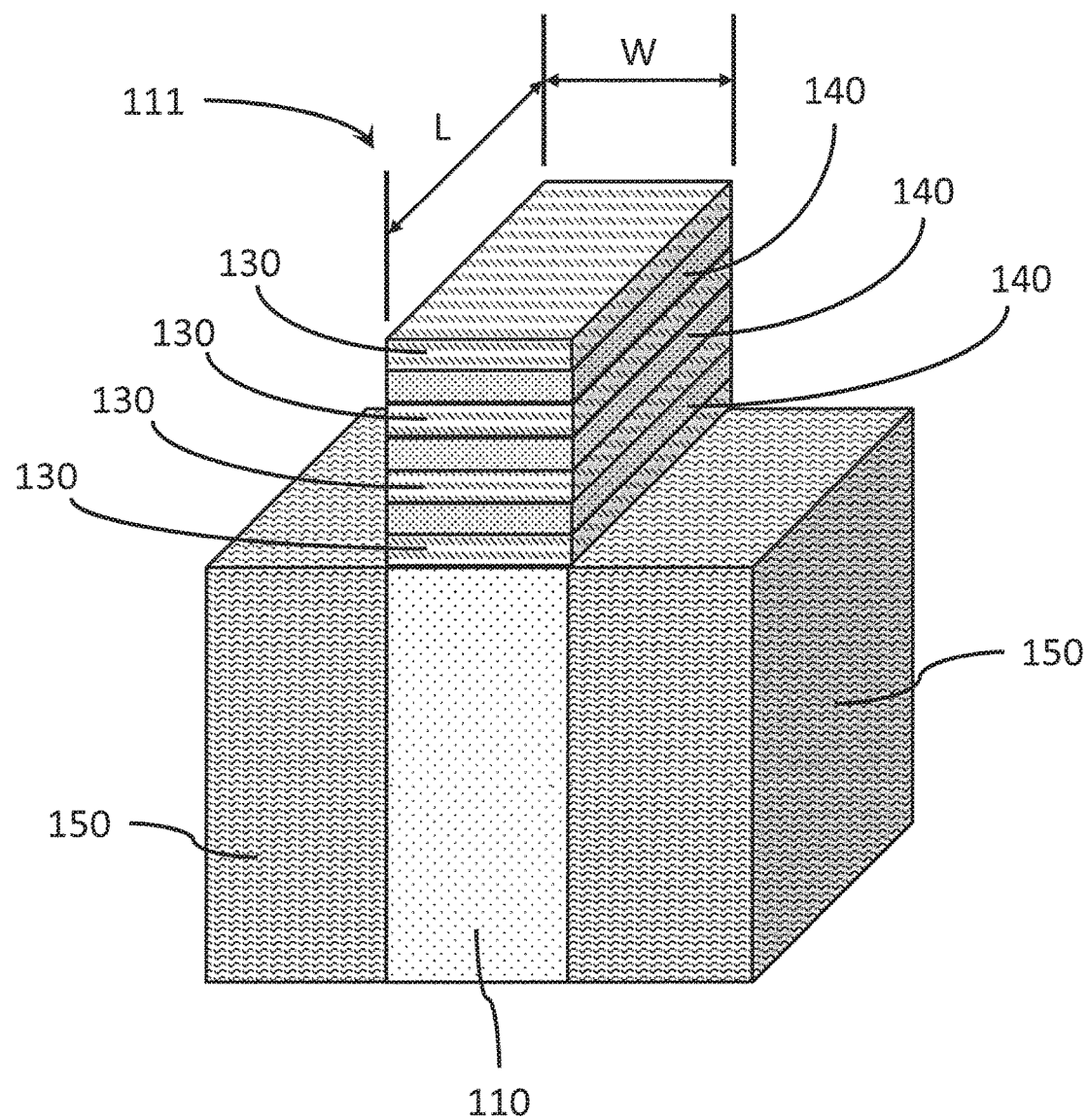
FIG. 3 is a cross-sectional perspective view of a patterned channel stack having a length, L, and a width, W, on a substrate with adjacent isolation regions, in accordance with an embodiment of the present invention.

FIG. 3 is a cross-sectional perspective view of a patterned channel stack having a length, L, and a width, W, on a substrate with adjacent isolation regions, in accordance with an embodiment of the present invention.

In one or more embodiments, the channel layer stack can be masked and patterned to form one or more channel stacks 111 on the substrate 110, where the process of masking and patterning can involve a sidewall image transfer process, self-aligned double patterning (SADP), or self-aligned quadruple patterning (SAQP) to provide a tight pitch between vertical fins, as would be known in the art.

In one or more embodiments, the patterned channel stack 111 can have a length, L, in the range of about 40 nm to about 1000 nm, or about 80 nm to about 500 nm, or about 120 nm to about 240 nm, although other lengths are contemplated.

In one or more embodiments, the patterned channel stack 111 can have a width, W, in the range of about 2 nm to about 100 nm, or about 10 nm to about 50 nm, or about 5 nm to about 40 nm, or about 20 nm to about 40 nm, although other widths are contemplated.

In one or more embodiments, isolation trenches can be formed in the substrate, where the isolation trenches can be adjacent to the channel stack 111. The isolation trenches can be formed during the patterning process when the channel stack sidewalls are being cut, for example, by a directional reactive ion etch (RIE), where the isolation trenches can be self-aligned with the sidewalls of the channel stack 111. The substrate 110 can be etched to form a self-aligned trench, where the depth of the trench can be predetermined to form an isolation region 150 between neighboring devices. In various embodiments, the isolation trench(es) can be filled with an insulating dielectric material, including, but not limited to, silicon oxide (SiO), or a low-k dielectric, as would be known in the art, to form an isolation region 150. In various embodiments, the isolation region 150 can be a shallow trench isolation (STI) region.

Figure 4:
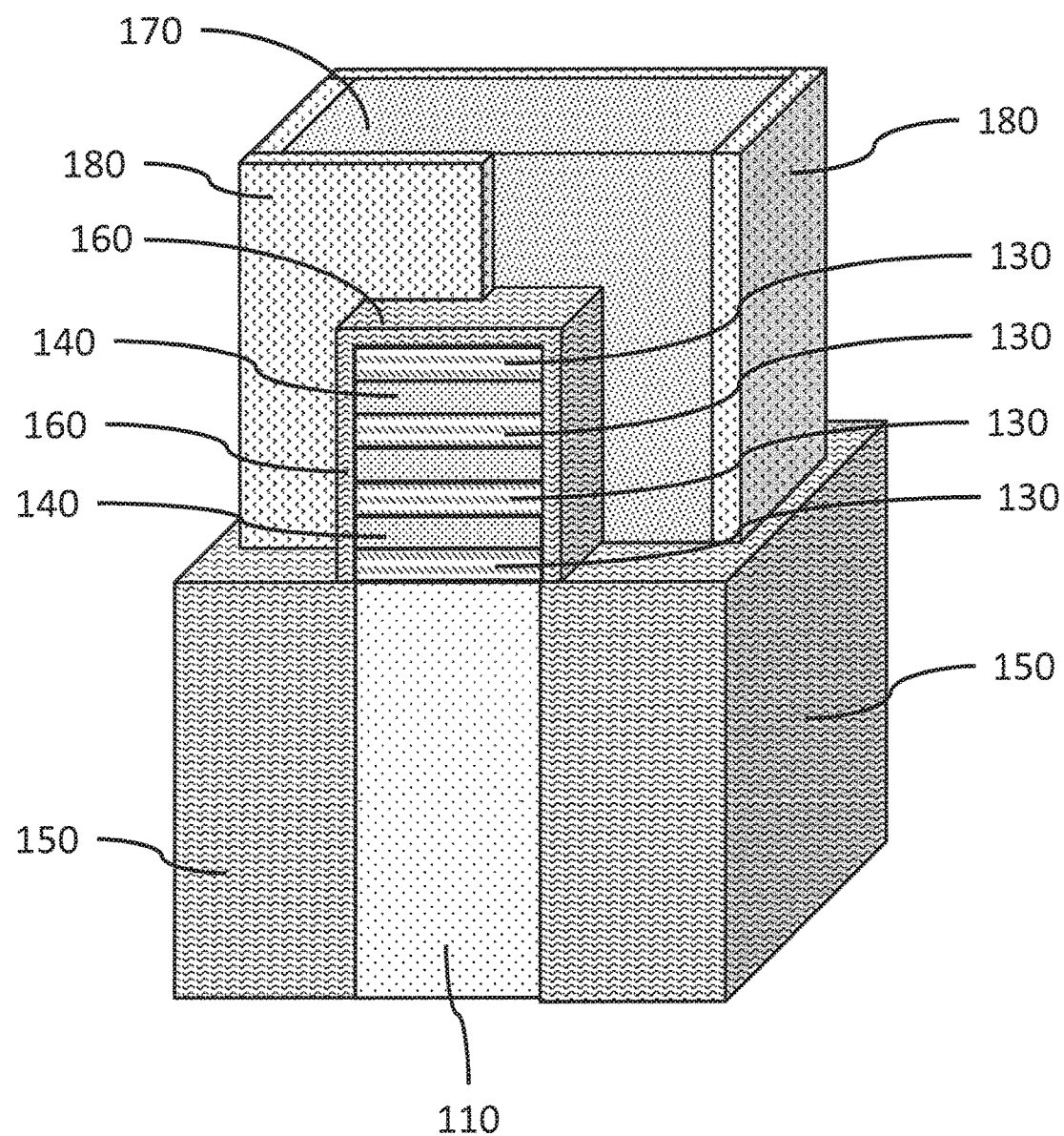
FIG. 4 is a cut-away perspective view of a patterned channel stack having a stack cover layer and a dummy gate with side spacers formed on the channel stack, in accordance with an embodiment of the present invention.

FIG. 4 is a cut-away perspective view of a patterned channel stack having a stack cover layer and a dummy gate with side spacers formed on the channel stack, in accordance with an embodiment of the present invention.

In one or more embodiments, a stack cover layer 160 can be formed on at least a portion of the channel stack 111. In various embodiments, the stack cover layer 160 can be formed on one or more channel stack(s) and at least a portion of the exposed surface of the substrate 110. The stack cover layer 160 can be blanket deposited or conformally deposited on the channel stack, substrate 110, and isolation regions 150. The stack cover layer 160 can be removed from the isolation regions 150 and substrate surface by an etch-back using a selective, dry plasma etch (e.g., reactive ion etch (RIE)).

In various embodiments, the stack cover layer 160 can be an oxide, for example, silicon oxide (SiO), or a nitride, for example, silicon nitride (SiN). The stack cover layer 160 can be formed by deposition on the exposed surfaces of the channel stack, or grown (e.g., thermal oxide) on the channel stack. The stack cover layer 160 can be formed on the exposed sides of the sacrificial release layer(s) 130 and nanosheet channel layers 140.

In one or more embodiments, the channel stack(s) 111 and stack cover layer 160 can be masked and patterned to provide open regions for formation of a dummy gate 170 on the stack cover layer 160 covering each of the one or more channel stacks. In various embodiments, three dummy gates 170 can be formed on each channel stack 111, where a dummy gate 170 can be formed on each end of the channel stack and a dummy gate 170 can be formed on a central portion of the channel stack. The dummy gates on the endwalls of the channel stack(s) can protect the channel stacks during subsequent processes.

In one or more embodiments, a dummy gate 170 can be formed on a stack cover layer 160 over one or more channel stacks 111, where the dummy gate 170 can be formed over three sides of the channel stack. In various embodiments, the dummy gate 170 can be a material that can be easily and selectively removed from the stack cover layer 160, including, but not limited to, poly-silicon (p-Si), amorphous silicon (a-Si), amorphous carbon (a-C), silicon oxide (SiO), silicon nitride (SiN), silicon oxynitride (SiON), and combinations thereof. In various embodiments, the dummy gate 170 may include multiple material layers (e.g., a capping layer), where the dummy gate can be a dummy gate stack.

In one or more embodiments, a sidewall spacer 180 can be formed on each of the dummy gates. The sidewall spacer 180 can be conformally deposited on the dummy gates 170 and etched back to expose the top surface of the dummy gate 170, the channel stack 111, and the substrate surface. A cut away of the sidewall spacer 180 revealing a portion of the dummy gate 170 is shown in FIG. 4, where the sidewall spacer 180 can be completely around the dummy gate 170.

In various embodiments, the sidewall spacer 180 can be a silicon nitride (SiN), a silicon carbonitride (SiCN), a silicon boronitride (SiBN), a silicon borocarbide (SiBC), a silicon boro carbonitride (SiBCN), a boron carbide (BC), a boron nitride (BN), a titanium nitride (TiN) or combinations thereof, where the dummy gate 170 and/or stack cover layer 160 can be selectively etched relative to the sidewall spacer 180.

Figure 5:
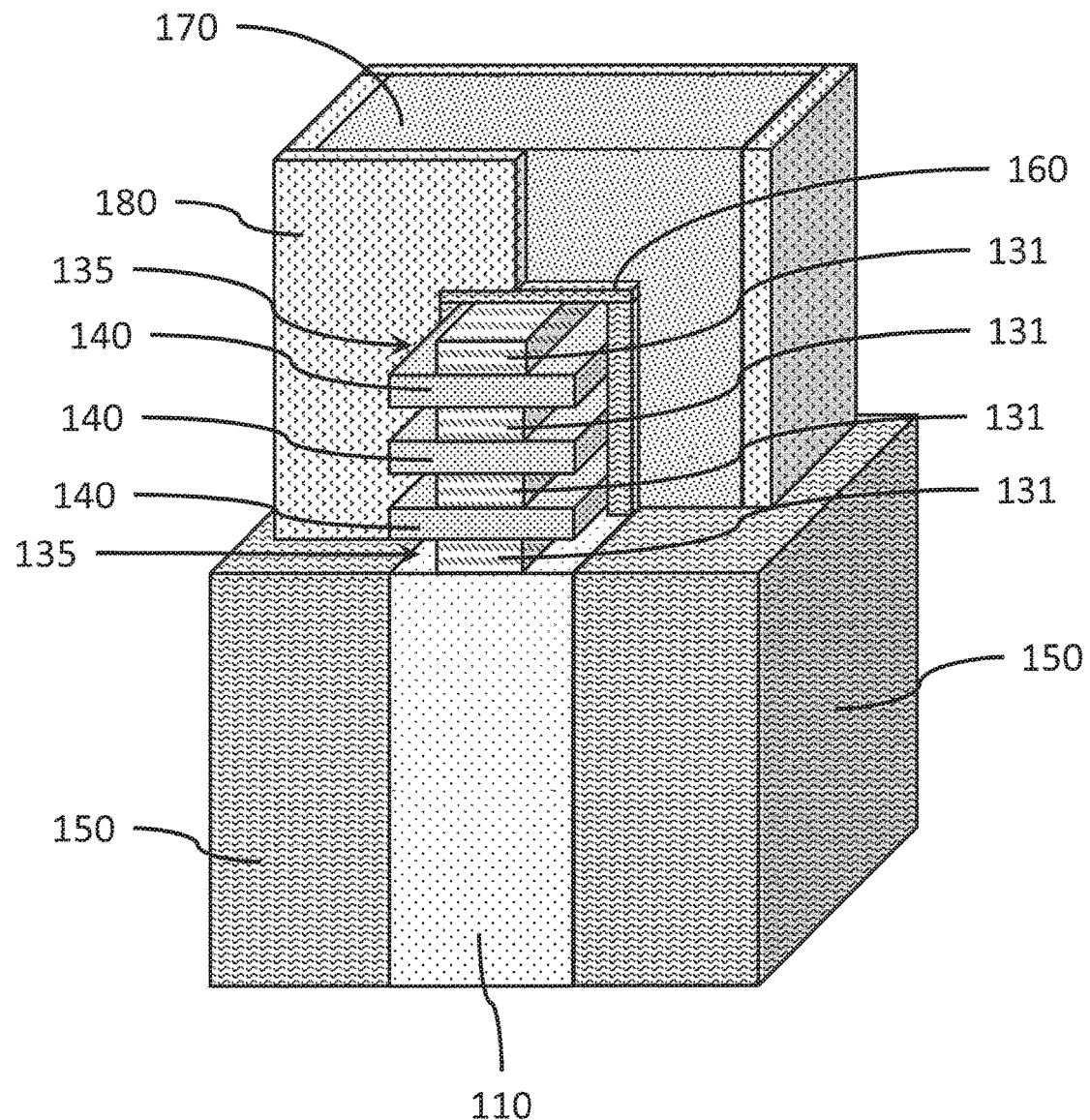
FIG. 5 is a cut-away perspective view of a patterned channel stack after removing a portion of the stack cover layer and a portion of each of the sacrificial release layers in the channel stack, in accordance with an embodiment of the present invention.

FIG. 5 is a cut-away perspective view of a patterned channel stack after removing a portion of the stack cover layer and a portion of each of the sacrificial release layers in the channel stack, in accordance with an embodiment of the present invention.

In one or more embodiments, the exposed portion of the stack cover layer 160 projecting out from the sidewall spacer 180 and dummy gate 170 can be removed to expose the sides of the sacrificial release layers 130 and nanosheet channel layers 140 in the gate stack 111. The stack cover layer 160 can be removed by an isotropic etch that removes the stack cover layer from the top and sidewalls of the channel stack.

In one or more embodiments, a portion of the one or more sacrificial release layers 130 can be partially removed to form recesses 135 in the channel stack leaving a sacrificial supporting rib 131 between each of the nanosheet channel layers 140. Each of the recesses 135 can extend into the area below the sidewall spacer 180 and dummy gate 170.

In one or more embodiments, the one or more sacrificial release layers 130 can be partially removed using a timed isotropic etch, for example, a wet etch, where the wet etchant can enter into the recesses 135 being formed. In various embodiments, a cavity can be formed below the stack cover layer 160 and sidewall spacer 180, where the isotropic etch removes sacrificial release layer material not otherwise exposed.

Figure 6:
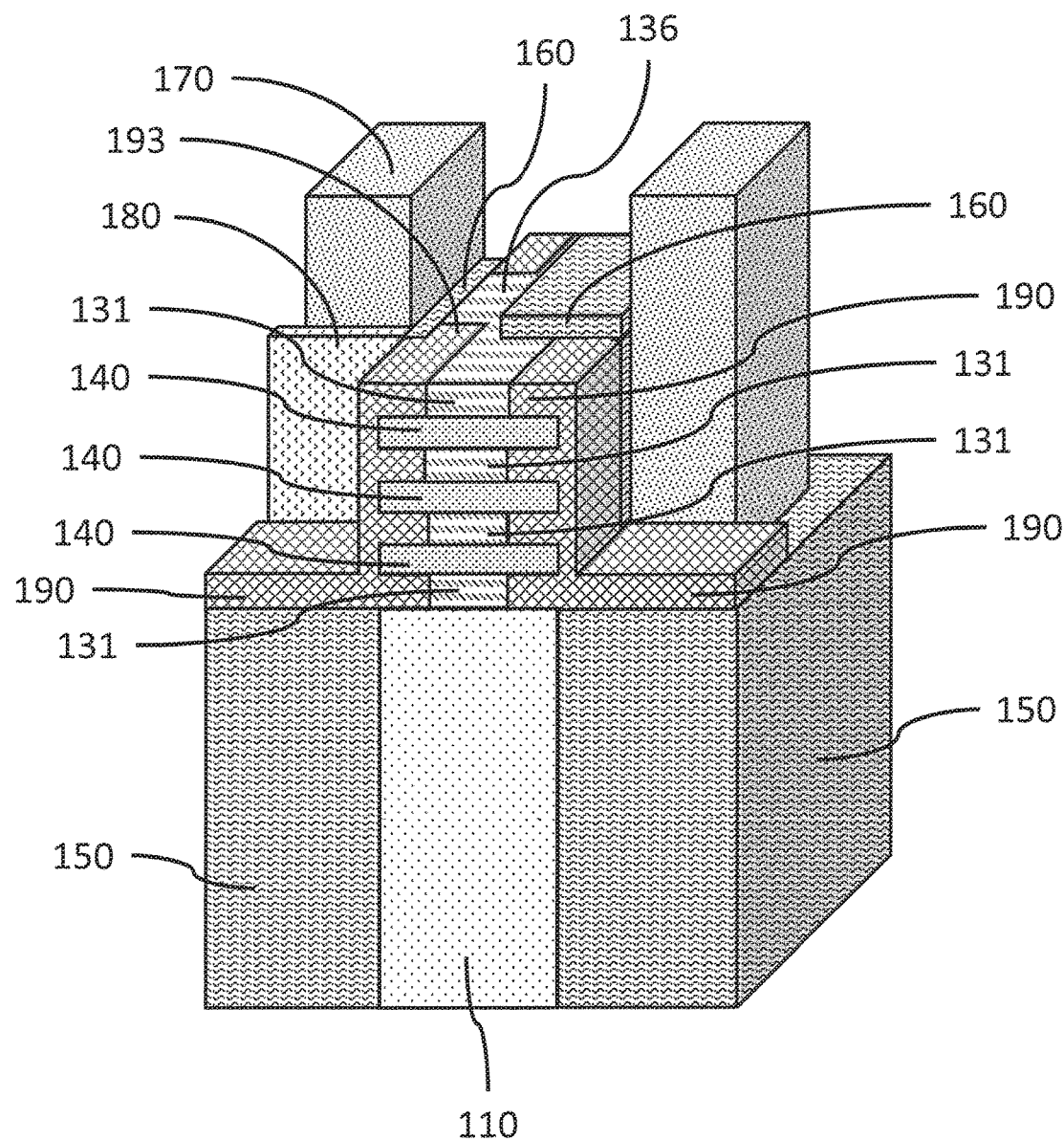
FIG. 6 is a cut-away perspective view of a patterned channel stack with a plurality of nanosheet channel layers, sacrificial supporting ribs between the nanosheet channel layers, and an inner spacer layer on the nanosheet channel layers and sacrificial supporting ribs, in accordance with an embodiment of the present invention.

FIG. 6 is a cut-away perspective view of a patterned channel stack with a plurality of nanosheet channel layers, sacrificial supporting ribs between the nanosheet channel layers, and an inner spacer layer on the nanosheet channel layers and sacrificial supporting ribs, in accordance with an embodiment of the present invention.

In one or more embodiments, an inner spacer layer 190 can be formed on the one or more nanosheet channel layer(s) 140 and one or more sacrificial supporting rib(s) 131, where the inner spacer layer 190 can fill the recesses 135 adjacent to the sacrificial supporting rib(s) 131, and between overhanging nanosheet channel layer(s) 140. The inner spacer layer 190 can fill the portion of recesses 135 below the stack cover layer 160, sidewall spacer 180, and dummy gate 170. The inner spacer layer 190 can be formed on at least a portion of the substrate 110.

In one or more embodiments, the inner spacer layer 190 can be formed by ALD, PEALD, CVD, PECVD, or combinations thereof, where the inner spacer layer 190 can be conformally deposited within the recesses 135 by ALD to fill the recesses 135. The conformal deposition can fill the cavities formed adjacent to a portion of the stack cover layer 160 and/or covered by a nanosheet channel layer 140 with a cavity fill 193. A CVD or PECVD deposition can be used to increase the thickness on the outer surfaces of the nanosheet channel layer(s) 140 and top sacrificial supporting rib 131.

In various embodiments, the sacrificial supporting rib(s) 131 can have a wider portion 136 under the dummy gate 170, where the etching process forming the recesses 135 did not remove material of the sacrificial release layer 130, and a narrower portion extending out from below the stack cover layer 160 and sidewall spacer 180. At least a portion of the sacrificial supporting rib(s) 131 can be narrower than adjacent nanosheet channel layer(s) 140. The sacrificial supporting rib(s) 131 can, thereby, form a cross-like shape, where the cavity fill 193 can be in each of the corners of the cross-like shaped sacrificial release layer on a nanosheet channel layer 140. Four cavity fills 193 can be in between the substrate and the bottom-most nanosheet channel layer 140, where one of the four cavity fills is located at each of the four corners of the at least one nano sheet channel layer.

FIG. 6 illustrates portions of the sidewall spacer 180 and stack cover layer 160 cut-away to show otherwise hidden portions of the dummy gate 170, underlying wider portion 136 of sacrificial supporting rib 131, and inner spacer layer 190 including cavity fill 193. Dummy gate(s) (not shown) can cover the ends of the channel stack 111 to prevent etching and/or depositions on the end faces of the nanosheet channel layer(s) 140 and sacrificial supporting rib(s) 131.

In one or more embodiments, the inner spacer layer 190 can be a silicon nitride (SiN), a silicon oxide (SiO), a high-k metal oxide, a low-K oxide or suitable combinations thereof. In various embodiments, the inner spacer layer 190 can be $Si_3N_4$ or $SiO_2$.

In various embodiments, the high-K metal oxide can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3}Nb_{2/3}O_3$). The high-k material can further include dopants such as lanthanum and/or aluminum. The stoichiometry of the high-K compounds can vary.

In various embodiments, the dummy gate 170 can be adjacent to the stack cover layer 160 on the channel stack 111, and covered by the sidewall spacer 180. The dummy gate 170 can be in direct contact with the stack cover layer 160.

Figure 7:
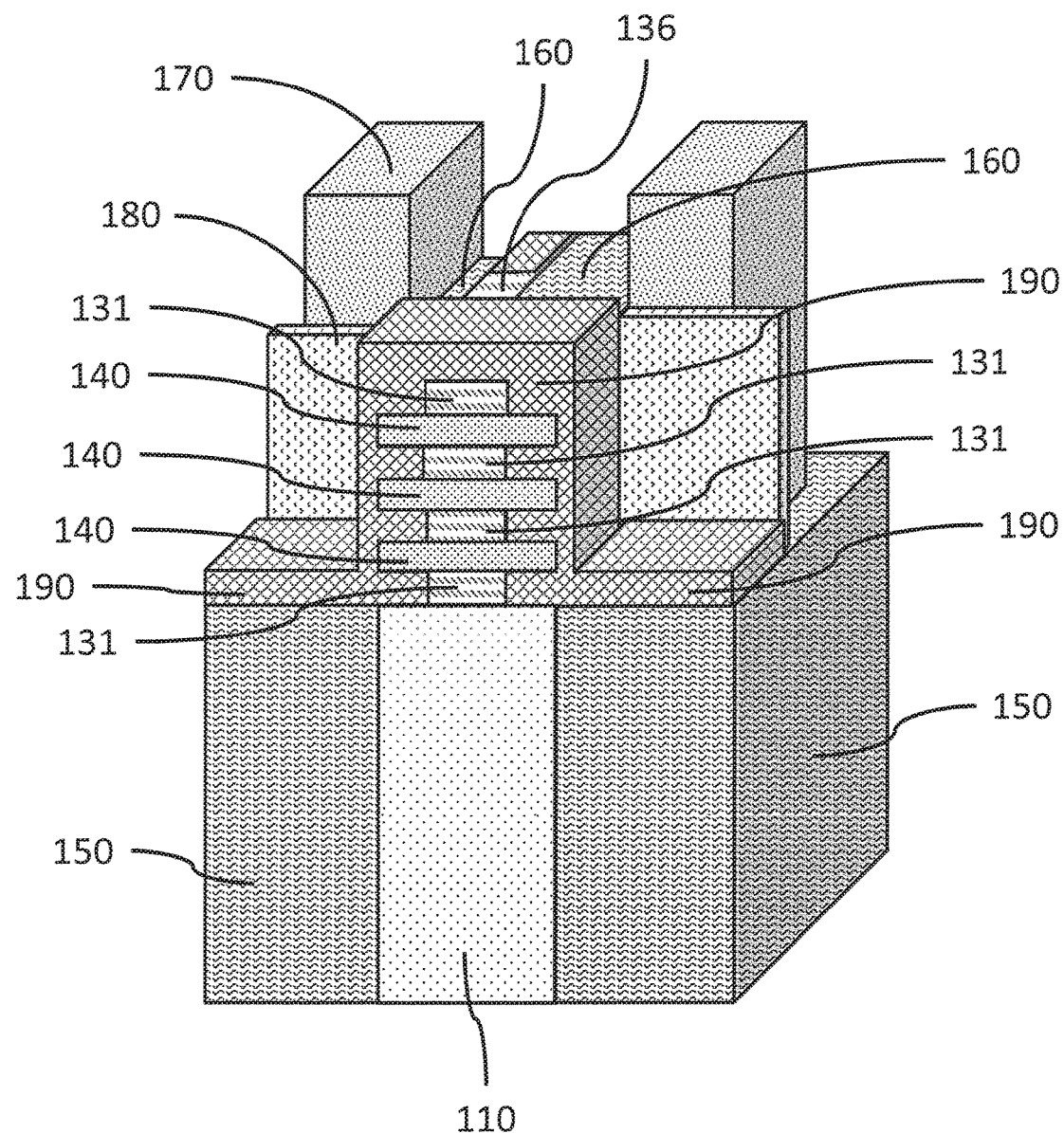
FIG. 7 is a cut-away perspective view of a patterned channel stack with a plurality of nanosheet channel layers, sacrificial supporting ribs between the nanosheet channel layers, and an inner spacer layer on the nanosheet channel layers and sacrificial supporting ribs, in accordance with an embodiment of the present invention.

FIG. 7 is a cut-away perspective view of a patterned channel stack with a plurality of nanosheet channel layers, sacrificial supporting ribs between the nanosheet channel layers, and an inner spacer layer on the nanosheet channel layers and sacrificial supporting ribs, in accordance with an embodiment of the present invention.

FIG. 7 illustrates the inner spacer layer 190 covering the channel stack 111 on three sides and extending along the exposed surface of the substrate 110 and isolation regions 150. Portions of the sidewall spacer 180 are shown in front of the dummy gate 170 along the sides of the channel stack. The top portion of the dummy gate is removed to show a portion of the stack cover layer 160 and wider portion 136 of the uppermost sacrificial supporting rib 131.

Figure 8:
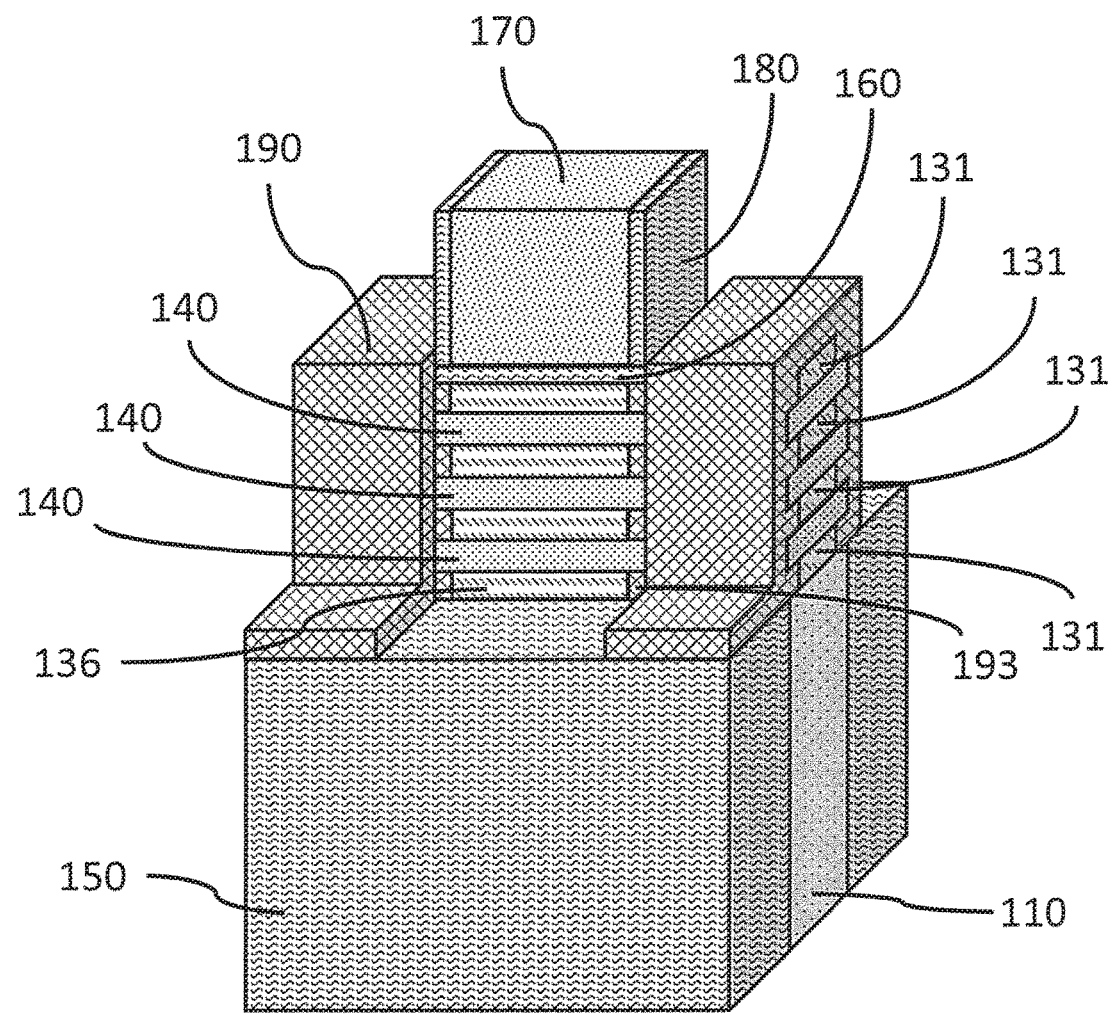
FIG. 8 is a cut-away perspective view of the long axis of the patterned channel stack with a plurality of nanosheet channel layers and sidewalls of the wider portion of the sacrificial supporting ribs between the nanosheet channel layers with the inner spacer layer filling the cavities, in accordance with an embodiment of the present invention.

FIG. 8 is a cut-away perspective view of the long axis of the patterned channel stack with a plurality of nanosheet channel layers and sidewalls of the wider portion of the sacrificial supporting ribs between the nanosheet channel layers with the inner spacer layer filling the cavities, in accordance with an embodiment of the present invention.

FIG. 8 depicts a side view of the channel stack 111 with a portion of the dummy gate 170 cut away to show the arrangement of the nanosheet channel layers 140, and cavity fills 193 positioned on either side of the wider portion 136 of the sacrificial supporting ribs 131, where a cavity fill 193 is also on either side of the narrower portion of sacrificial supporting rib(s) 131 and below a portion of the sidewall spacer 180. The inner spacer layer 190 covers the portions of the channel stack extending out from either side of the dummy gate 170 and sidewall spacer 180.

Figure 9:
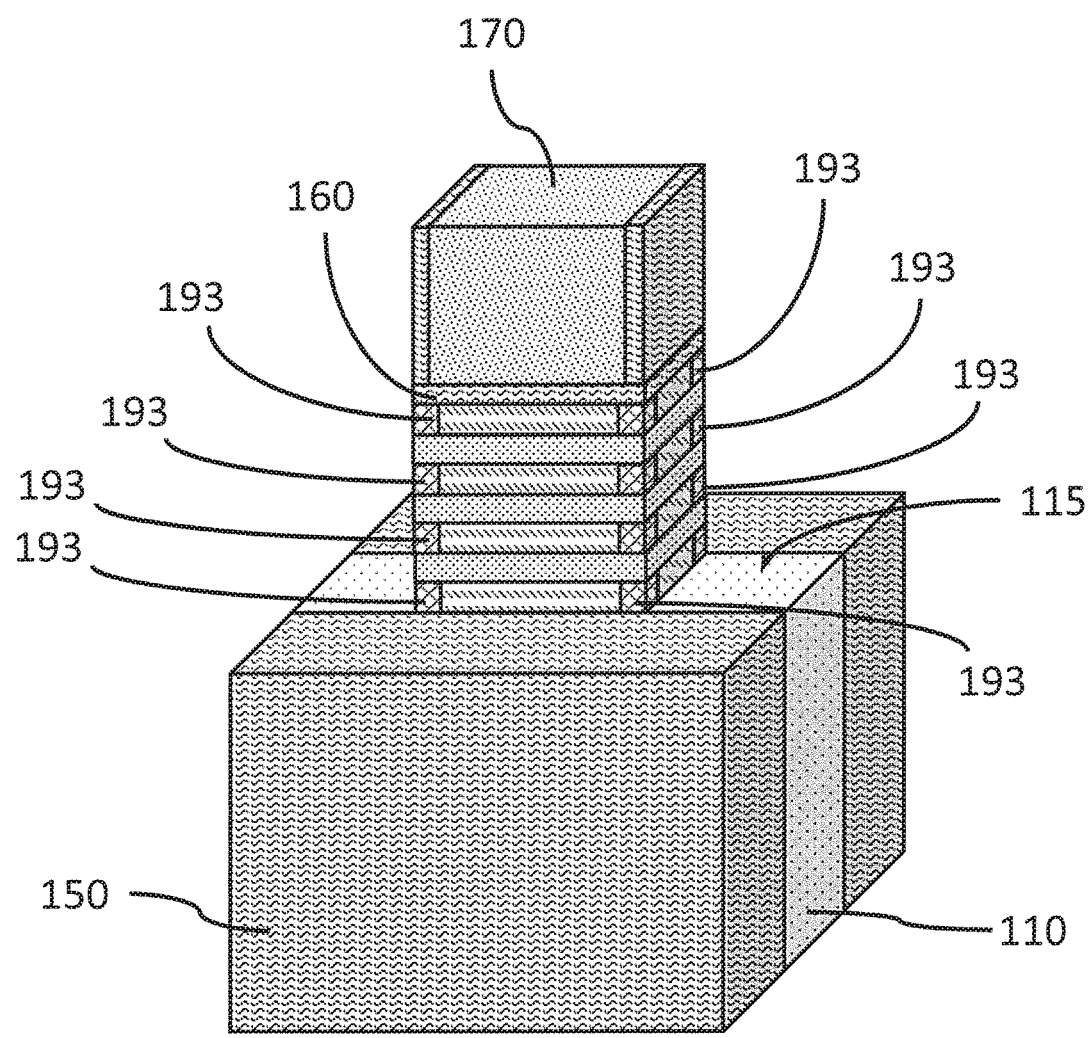
FIG. 9 is a cut-away perspective view of the long axis of the patterned channel stack after removing the portions of the channel stack extending out from either side of the dummy gate and sidewall spacer, in accordance with an embodiment of the present invention.

FIG. 9 is a cut-away perspective view of the long axis of the patterned channel stack after removing the portions of the channel stack extending out from either side of the dummy gate and sidewall spacer, in accordance with an embodiment of the present invention.

In one or more embodiments, a portion of the inner spacer layer 190 can be removed from the patterned channel stack 111 to expose the sacrificial supporting ribs 131 and nanosheet channel layers 140 not covered by the stack cover layer 160 and/or sidewall spacer 180. The inner spacer layer 190 can be removed by a non-selective anisotropic etch (e.g., a non-selective RIE), where the anisotropic etch can be a directional dry plasma etch, which can be a timed etch. In various embodiments, a portion of the inner spacer layer 190 can be selectively removed relative to the stack cover layer 160, sacrificial supporting ribs 131 and nanosheet channel layers 140.

In various embodiments, the portion of the inner spacer layer 190 within the section of the recesses 135 forming cavities under the stack cover layer 160 are not removed by the directional RIE, but form a rectangular cavity fill 193 at each corner of the nanosheet channel layers 140 in the channel stack. The rectangular cavity fill 193 do not extend across the narrower portion of the supporting ribs 131. In various embodiments, a single RIE can be used for removing both the inner spacer layer 190 and for the source/drain recess etch.

In one or more embodiments, the portions of the sacrificial supporting ribs 131 and nanosheet channel layers 140 extending out from either side of the dummy gate 170 and sidewall spacer 180 can be removed by a directional dry plasma etch (e.g., reactive ion etch (RIE)), where the dummy gate 170 and sidewall spacer 180 can act as a mask for the etching. Removal of the sacrificial supporting ribs 131 and nanosheet channel layers 140 can expose a face of the rectangular or cubic cavity fills 193 beneath the dummy gate 170, and the surface 115 of the substrate 110. Removal of the portion of the nanosheet channel layer 140 from either side of the dummy gate 170 can leave a rectangular nanosheet channel layer 140 in the gate stack. Reference to a rectangular shape is intended to include a square as well.

FIG. 9 depicts a side view of the channel stack 111 with a portion of the dummy gate 170 cut away to show the arrangement of the nanosheet channel layers 140, and cavity fills 193 after removal of portions of the sacrificial supporting ribs 131 and nanosheet channel layers 140.

Figure 10:
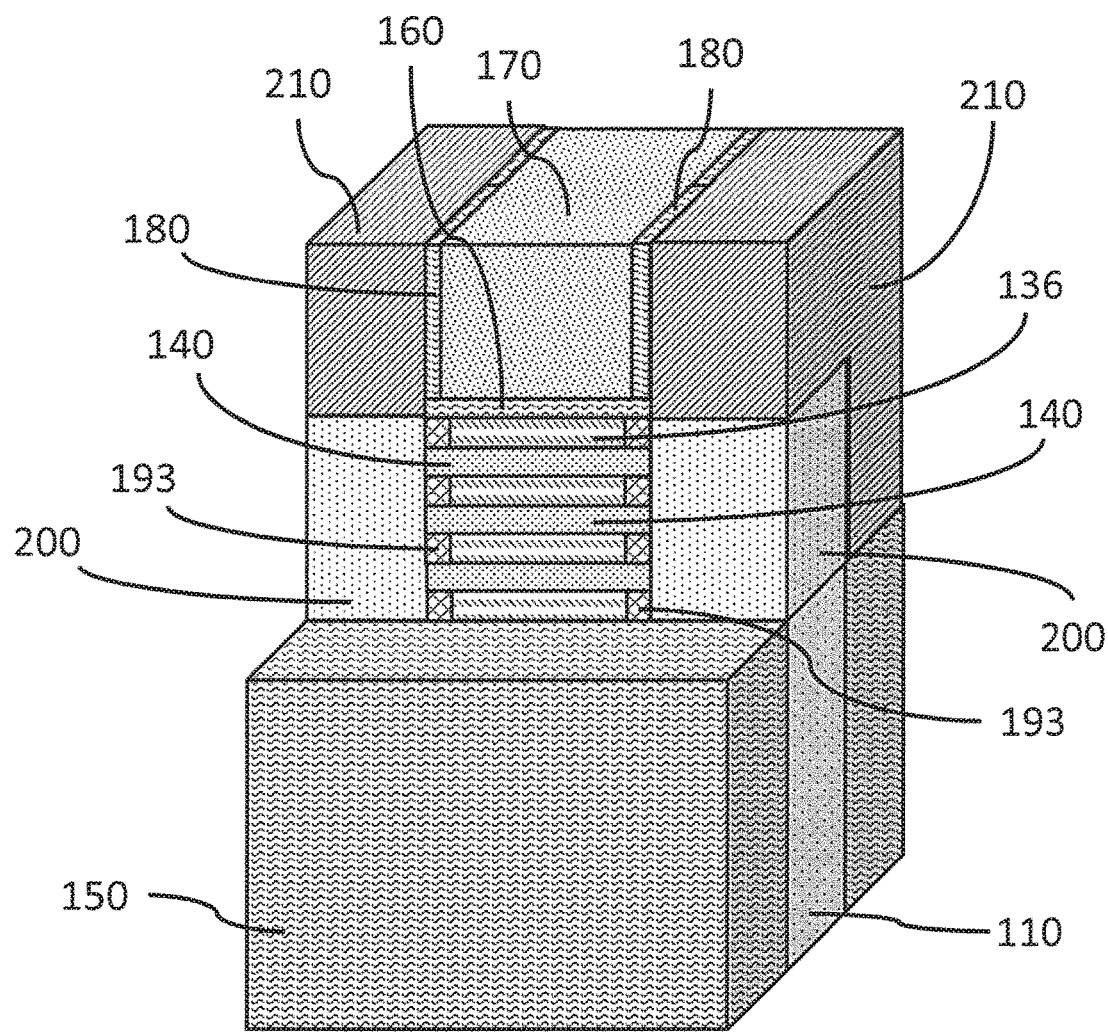
FIG. 10 is a cut-away perspective view of the long axis of the patterned channel stack after forming source/drain regions on either side of the channel stack and dummy gate, in accordance with an embodiment of the present invention.

FIG. 10 is a cut-away perspective view of the long axis of the patterned channel stack after forming source/drain regions on either side of the channel stack and dummy gate, in accordance with an embodiment of the present invention.

In one or more embodiments, a source/drain region 200 can be formed on an exposed portion of the channel stack 111, where the source/drain region 200 can be epitaxially grown on the exposed portion of the substrate surface 115 and/or exposed portions of the nanosheet channel layers 140 and sacrificial supporting ribs 131. In various embodiments, the surface 115 of a single crystal substrate 110 exposed by removal of portions of the channel stack 111 can provide a suitable surface for epitaxial growth of source/drain regions 200 on either side of the dummy gate 170.

In various embodiments, the sidewall surfaces of the nanosheet channel layers 140 and sacrificial supporting ribs 131 can provide a crystalline surface for epitaxial growth of the source/drain regions 200. The cavity fills 193 can allow the nanosheet channel layers 140 and sacrificial supporting ribs 131 to have crystal plane continuity along the sidewall, while preventing lateral encroachment. The stacked nanosheet channel layers 140 and sacrificial supporting ribs 131 can provide a continuous sidewall for epitaxial growth of the source/drain regions 200, since the nanosheet channel layers 140 and sacrificial supporting ribs 131 have the same crystal structure, where alternating nanosheet channel layers and sacrificial release layers have been heteroepitaxially grown on each other. The source/drain regions 200 can, thereby, grow on the sidewall of the gate stack in conjunction with the upward growth from a crystalline surface of a substrate 110. The source/drain regions 200 can still epitaxially grow on the sidewall of the gate stack alone if the substrate surface is an amorphous layer (e.g., buried oxide layer of an SOI).

In various embodiments, the sidewalls can have a different crystal face exposed than the surface of the substrate, such that epitaxial growth may occur at different rates on the two different surfaces. The substrate surface, for example, may be a (100) face, whereas the sidewalls may be (110). One of the surfaces may thereby provide the predominant growth surface for forming the source/drain regions 200. In various embodiments, the nanosheet channel layers 140 and sacrificial supporting ribs 131 can provide the predominant growth surface for forming the source/drain regions 200.

In various embodiments, the source/drain region(s) 200 can be silicon or silicon-germanium suitably doped to form an n-type or a p-type field effect transistor (NFET or PFET). The source/drain region(s) 200 can be in physical and electrical contact with each of the one or more nanosheet channel layer(s) 140 in the channel stack 111.

In one or more embodiments, an interlayer dielectric (ILD) 210 can be formed on the source/drain region(s) 200. The interlayer dielectric (ILD) 210 can be formed by a blanket deposition that covers the source/drain region(s) 200, as well as portions of the dummy gate 170, isolation regions 150, and substrate surface 115. The interlayer dielectric (ILD) 210 can extend above the top surface of the dummy gate 170, and chemical-mechanical polishing (CMP) can be utilized to remove the excess material and provide a smooth, flat surface.

In various embodiments, the interlayer dielectric (ILD) 210 can be silicon oxide or a low-k dielectric, where the ILD can be formed by CVD, LPCVD, or spun on. In various embodiments, a low-k dielectric material can be a fluoride-doped silicon oxide (e.g., fluoride doped glass), a carbon-doped silicon oxide, a porous silicon oxide, a spin-on silicon based polymeric material (e.g., tetraethyl orthosilicate (TEOS), hydrogen silsesquioxane (HSQ) and methylsilsesquioxane (MSQ)), or combinations thereof.

FIG. 10 depicts a portion of the dummy gate 170 and sidewall spacer 180 cut-away to show the source/drain regions 200 on the substrate 110 and in contact with the channel stack 111. The cavity fill(s) 193 are shown remaining in the corners of the channel stack adjacent to the wider portion 136 of the sacrificial supporting ribs 131. The portion of the ILD 210 that would wrap around and cover the sidewalls of the source/drain regions 200 and be on the isolation region 150 is also cut away to show the source/drain regions 200 on either side of the nano sheet channel layer(s) 140.

Figure 11:
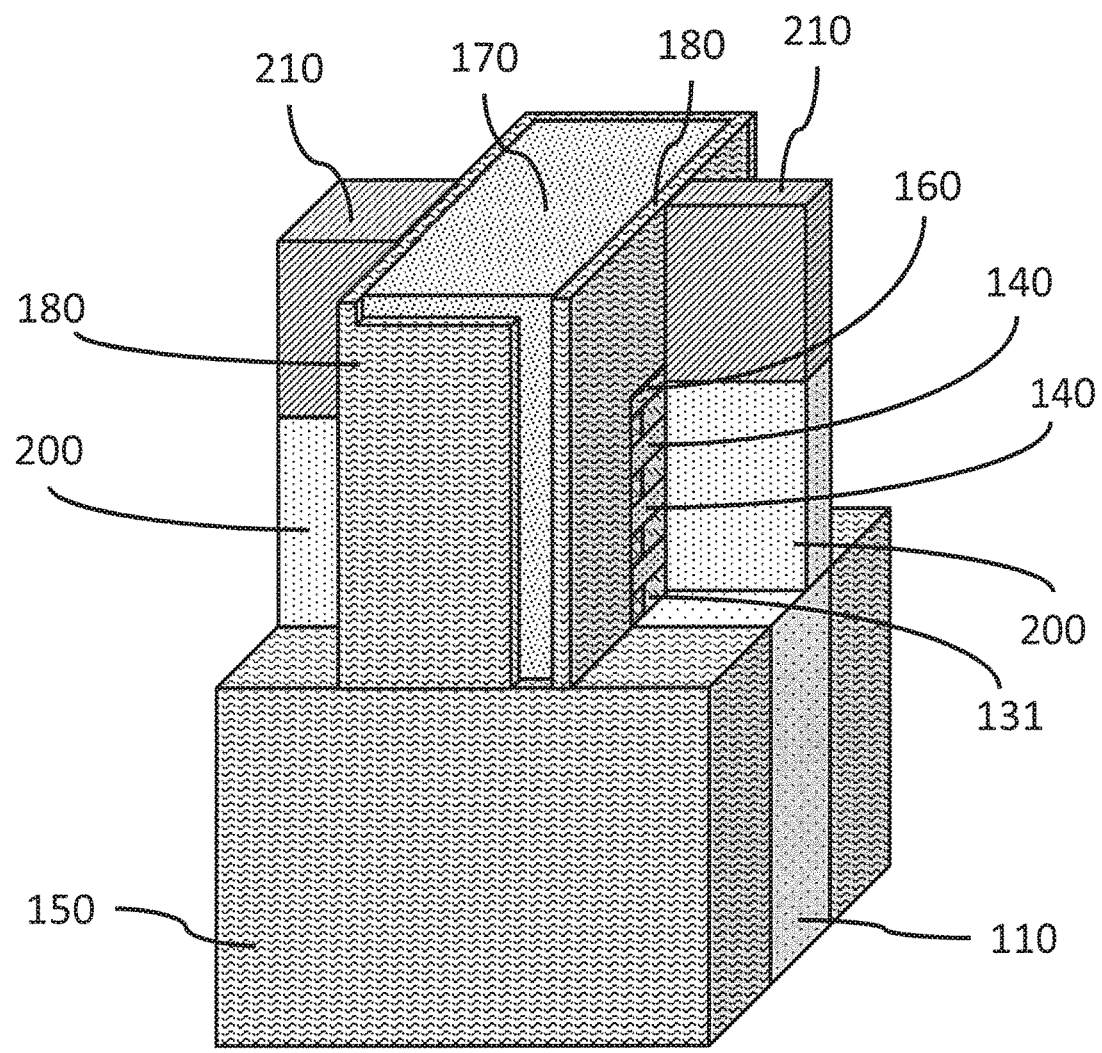
FIG. 11 is a cut-away perspective view of the long axis of the patterned channel stack prior to removing the dummy gate, in accordance with an embodiment of the present invention.

FIG. 11 is a cut-away perspective view of the long axis of the patterned channel stack prior to removing the dummy gate, in accordance with an embodiment of the present invention.

FIG. 11 depicts the sidewall spacer 180 surrounding the dummy gate 170 except for a partial cut-away to show the dummy gate 170 extending to the isolation region 150 and substrate 110 around the sacrificial supporting ribs 131 and nanosheet channel layer(s) 140 of the channel stack 111. A portion of the source/drain region 200 and ILD 210 is also cut away to show the dummy gate extending around three sides of the channel stack, and the cavity fill 193, and end faces of the sacrificial supporting ribs 131 and nanosheet channel layer(s) 140. The rectangular cavity fills 193 are located at either side of the sacrificial supporting ribs 131 on the corners of the nanosheet channel layer(s) 140.

Figure 12:
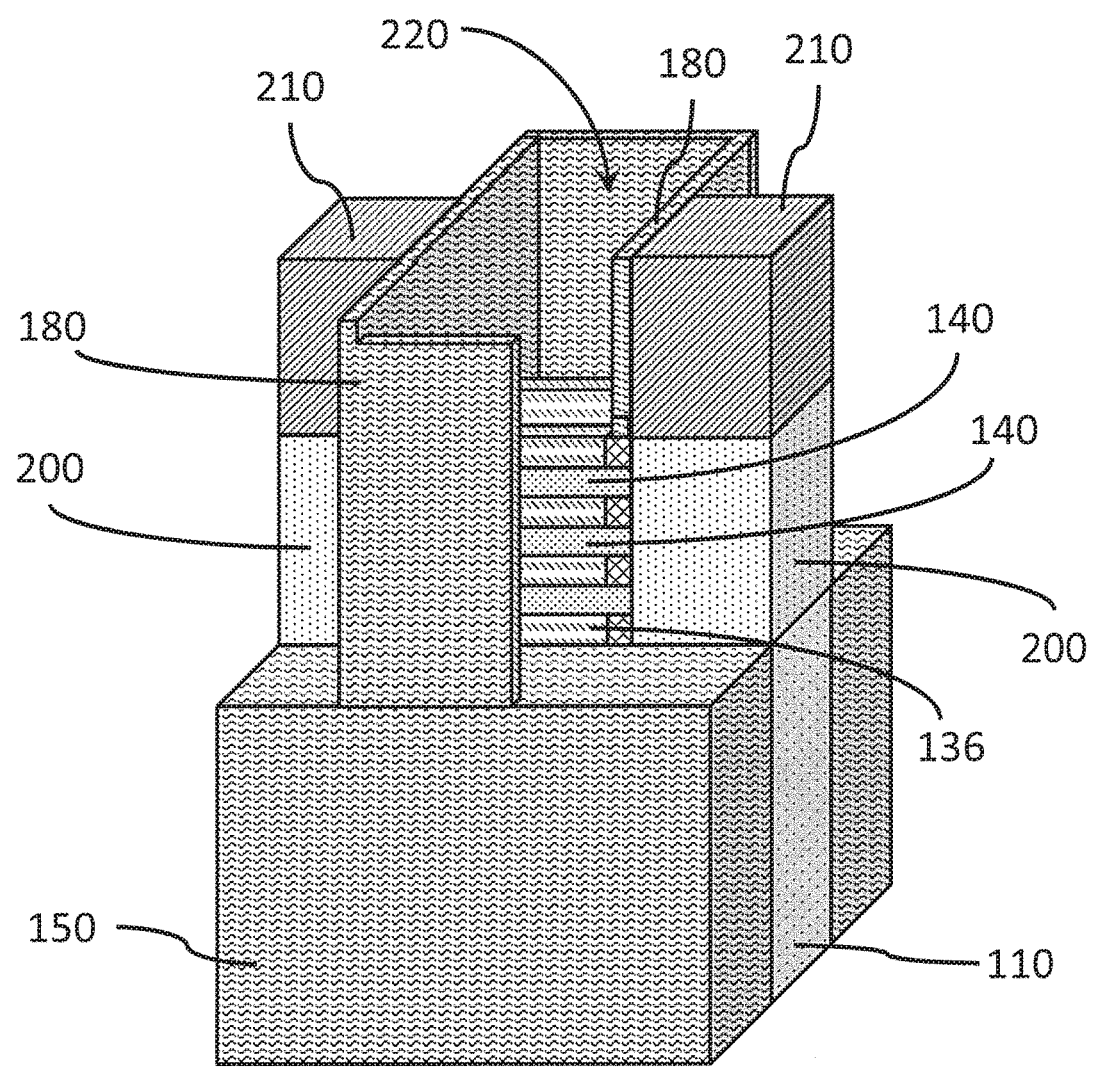
FIG. 12 is a cut-away perspective view of the long axis of the patterned channel stack after removing the dummy gate, in accordance with an embodiment of the present invention.

FIG. 12 is a cut-away perspective view of the long axis of the patterned channel stack after removing the dummy gate and stack cover layer, in accordance with an embodiment of the present invention.

In one or more embodiments, the dummy gate 170 and stack cover layer 160 can be removed to expose the underlying channel stack 111. The dummy gate and stack cover layer can be selectively removed. The sidewall spacer 180 can remain around the channel stack to provide a defined opening 220 for formation of an active gate structure.

In one or more embodiments, the dummy gate 170 can be removed by an isotropic etch, for example, a wet etch, that is selective for the material of the dummy gate 170 relative to the sidewall spacer 180, sacrificial supporting ribs 131, and nanosheet channel layers 140. Removal of the dummy gate 170 can expose the remaining portions of the sacrificial supporting ribs 131. The top surface of the top-most sacrificial supporting ribs 131 may be exposed by removal of the dummy gate 170 and stack cover layer 160.

Figure 13:
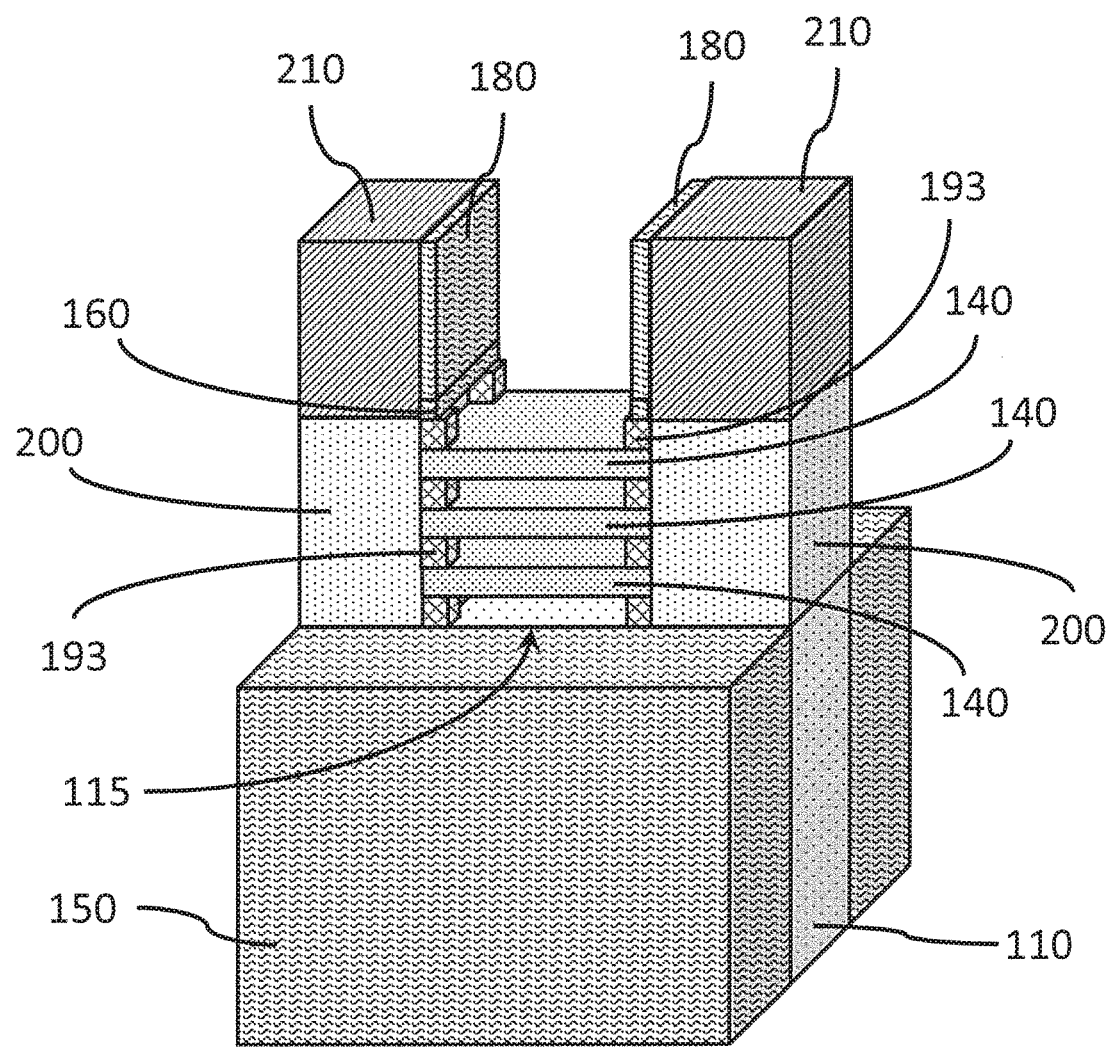
FIG. 13 is a cut-away perspective view of the long axis of the channel stack after removing the remaining portions of the sacrificial supporting ribs, in accordance with an embodiment of the present invention.

FIG. 13 is a cut-away perspective view of the long axis of the channel stack after removing the remaining portions of the sacrificial supporting ribs, in accordance with an embodiment of the present invention.

In one or more embodiments, the remaining portions of the sacrificial supporting ribs 131 including the wider portion 136, can be removed to release the nanosheet channel layers 140, where the nanosheet channel layers 140 can be secured at the opposite end faces to the source/drain regions 200. The cavity fills 193 can be between the substrate surface and the bottom-most nanosheet channel layer 140, and between each of the nano sheet channel layers 140, where there can be four cavity fills 193 with each cavity fill 193 positioned at one of the four corners of each nanosheet channel layer. At least two cavity fills can be adjacent to a source/drain region 200.

In one or more embodiments, the sacrificial supporting ribs 131 can be removed using an isotropic etch, for example, a wet etch selective for the material of the sacrificial supporting ribs 131. In various embodiments, the etchant can be introduced into the opening 220, such that the etchant can access the sides of the channel stack 111 including the sidewalls of the wider portion 136 of sacrificial supporting ribs 131.

FIG. 13 depicts the nanosheet channel layers 140 between the source/drain regions 200. The dummy gate was previously removed, and the sidewall spacer 180 is not shown to provide a clear view of the remaining portion of the channel stack 111. Only a portion of the stack cover layer 160 is shown along the bottom edges of the portion of the sidewall spacer 180. A portion of the ILD 210 is shown adjacent to the portion of the sidewall spacer 180. A portion of the substrate surface 115 is visible below the lowest nanosheet channel layer 140. The cavity fills 193 can be seen adjacent to the source/drain regions 200 and separating the nanosheet channel layers 140.

Figure 14:
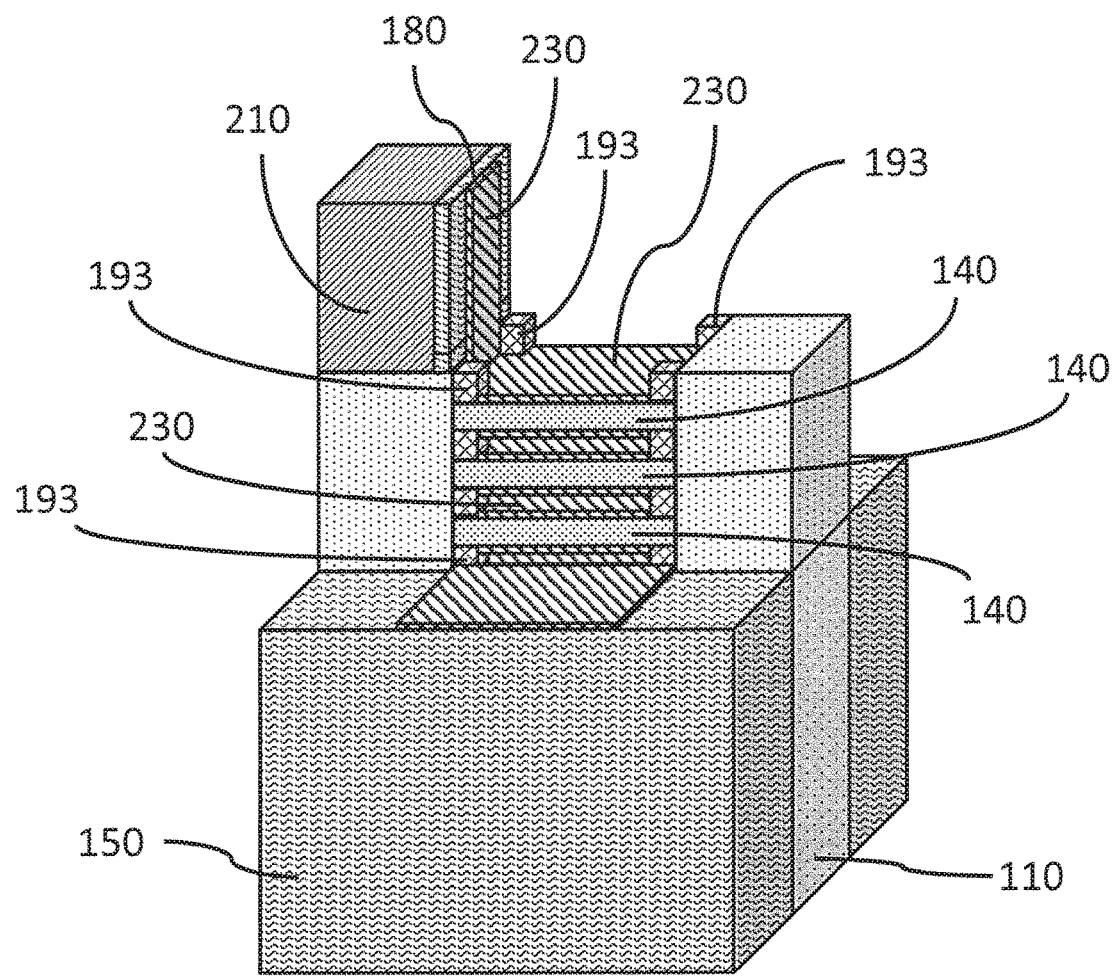
FIG. 14 is a cut-away perspective view of the long axis of the channel stack with a gate dielectric layer formed on the exposed surfaces of the nanosheet channel layers, in accordance with an embodiment of the present invention.

FIG. 14 is a cut-away perspective view of the long axis of the channel stack with a gate dielectric layer formed on the exposed surfaces of the nanosheet channel layers, in accordance with an embodiment of the present invention.

In one or more embodiments, a gate dielectric layer 230 can be formed on the exposed surfaces of the nanosheet channel layer(s) 140, where the gate dielectric layer 230 can be formed by a conformal deposition process, for example, ALD, CVD, or combinations thereof. In various embodiments, the precursors for the gate dielectric layer 230 can be selected based on the ability of entering the spaces formed between the nanosheet channel layer(s) 140 vacated by the sacrificial supporting ribs 131. In one or more embodiments, the precursors for the gate dielectric layer 230 can be introduced into the opening 220.

In one or more embodiments, the gate dielectric layer 230 can be formed on the exposed surfaces of the isolation regions 150 at the bottom of the opening 220 within the sidewall spacer 180. The gate dielectric layer 230 can also be formed on the inside surfaces of the sidewall spacer 180, stack cover layer 160, and cavity fills 193.

FIG. 14 depicts the gate dielectric layer 230 on the exposed surfaces of the nanosheet channel layer(s) 140, where a portion of the sidewall spacer 180 is not shown to allow a clear view of the gate dielectric layer 230 and nanosheet channel layers 140. A portion of the gate dielectric layer 230 is shown on the illustrated portion of the sidewall spacer 180, whereas other components of the nanosheet device are not shown for the sake of clarity.

In one or more embodiments, the gate dielectric layer 230 can be an insulating dielectric layer, for example, a silicon oxide (SiO), silicon nitride (SiN), silicon oxynitride (SiON), a high-K dielectric, or a suitable combination of these materials.

In various embodiments, the gate dielectric layer 230 can be a high-K dielectric material that can include, but is not limited to, transition metal oxides such as hafnium oxide (e.g., $HfO_2$), hafnium silicon oxide (e.g., $HfSiO_4$), hafnium silicon oxynitride ($Hf_wSi_xO_yN_z$), lanthanum oxide (e.g., $La_2O_3$), lanthanum aluminum oxide (e.g., $LaAlO_3$), zirconium oxide (e.g., $ZrO_2$), zirconium silicon oxide (e.g., $ZrSiO_4$), zirconium silicon oxynitride ($Zr_wSi_xO_yN_z$), tantalum oxide (e.g., $TaO_2$, $Ta_2O_5$), titanium oxide (e.g., $TiO_2$), barium strontium titanium oxide (e.g., $BaTiO_3$—$SrTiO_3$), barium titanium oxide (e.g., $BaTiO_3$), strontium titanium oxide (e.g., $SrTiO_3$), yttrium oxide (e.g., $Y_2O_3$), aluminum oxide (e.g., $Al_2O_3$), lead scandium tantalum oxide ($Pb(Sc_xTa_{1-x})O_3$), and lead zinc niobate (e.g., $PbZn_{1/3} Nb_{2/3} O_3$). The high-K material can further include dopants such as lanthanum and/or aluminum. The stoichiometry of the high-K compounds can vary.

In various embodiments, the gate dielectric layer 230 can have a thickness in the range of about 1 nm to about 5 nm, or can have a thickness in the range of about 1 nm to about 3 nm.

Figure 15:
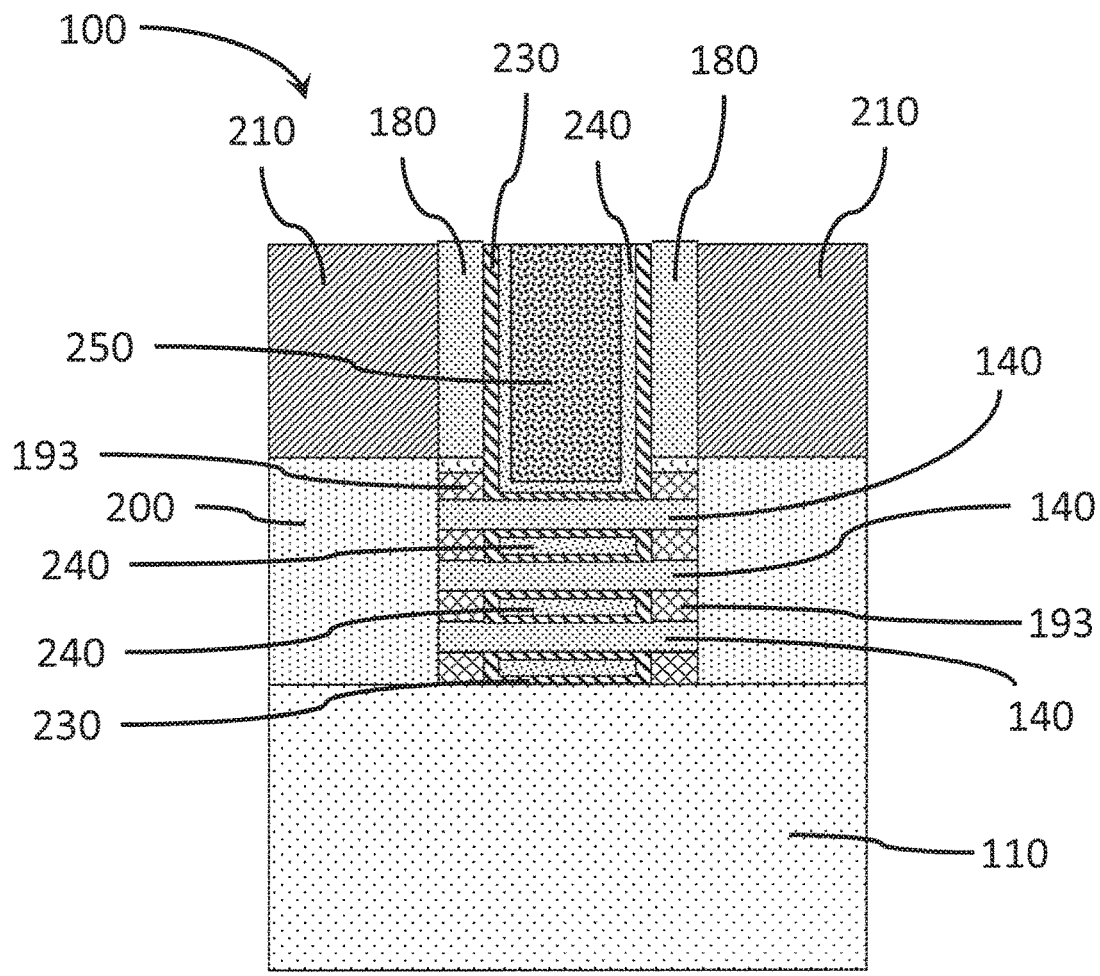
FIG. 15 is a cross-sectional side view of the long axis of the nanosheet device 100 with source/drain regions on opposite ends of the nanosheet channel layer(s), and a gate structure on and around each of the one or more nanosheet channel layer(s), in accordance with an embodiment of the present invention.

FIG. 15 is a cross-sectional side view of the long axis of the nanosheet device 100 with source/drain regions on opposite ends of the nanosheet channel layer(s), and a gate structure on and around each of the one or more nanosheet channel layer(s), in accordance with an embodiment of the present invention.

In one or more embodiments, a work function layer 240 can be formed on the gate dielectric layer 230, where the work function layer 240 and gate dielectric layer 230 can surround at least a portion of each of the one or more nanosheet channel layer(s) 140. A work function layer 240 can be formed on the exposed portion(s) of the gate dielectric layer 230 between the nanosheet channel layer(s) 140. The work function layer 240 can be formed on the gate dielectric layer 230 to adjust the electrical properties of the gate electrode. In various embodiments, the work function layer 240 can be optional. A portion of the work function layer can be formed on the gate dielectric layer 230 on the substrate surface 115 beneath the bottom nanosheet channel layer 140.

In one or more embodiments, the work function layer 240 can fill in the spaces between the gate dielectric layer 230 and nanosheet channel layer(s) 140. The work function layer 240 can be formed by a conformal deposition, for example, ALD.

In various embodiments, a work function layer 240 can be a conductive nitride, including but not limited to titanium nitride (TiN), titanium aluminum nitride (TiAlN), hafnium nitride (HfN), hafnium silicon nitride (HfSiN), tantalum nitride (TaN), tantalum silicon nitride (TaSiN), tungsten nitride (WN), molybdenum nitride (MoN), niobium nitride (NbN); a conductive carbide, including but not limited to titanium carbide (TiC), titanium aluminum carbide (TiAlC), tantalum carbide (TaC), hafnium carbide (HfC); or combinations thereof. The work function layer 240 can include multiple layers of work function materials, for example, a work function layer 240 can be a TiN/TiC stack.

In various embodiments, the work function layer 240 can have a thickness in the range of about 1 nm to about 11 nm, or can have a thickness in the range of about 1 nm to about 5 nm.

In one or more embodiments, a gate fill layer 250 can be formed on the gate dielectric layer 230 and/or work function layer 240 if present, where the gate fill layer 250 can fill in the space 220 between interlayer dielectric 240. The gate fill layer 250, gate dielectric layer 230, and optionally the work function layer 240, can form a gate structure on one or more nanosheet channel layer(s) 140, where the gate fill layer 250 and work function layer 240 can form a conductive gate electrode.

In various embodiments, the gate fill layer 250 can be blanket deposited on the exposed surfaces of the gate dielectric layer 210 and/or work function layer 240 on the nanosheet channel layers 140. The formed gate fill layer 250 can extend above the top surface of the interlayer dielectric 210, where the gate fill layer material above the top surfaces of the interlayer dielectric 210 can be removed by a CMP to provide a flat, uniform surface.

In various embodiments, the gate fill layer 250 can be a conductive metal, where the metal can be tungsten (W), titanium (Ti), molybdenum (Mo), cobalt (Co), or a conductive carbon material (e.g., carbon nanotube, graphene, etc.), or any suitable combinations thereof.

In various embodiments, each of the four cavity fills 193 can be separated from the other cavity fills on the same layer by at least a portion of the gate structure, where the cavity fills 193 can reduce the amount of surface area directly between the gate structure and the source/drain regions 200. At least a portion of the conductive gate electrode can be separated from the adjacent portion of the source/drain regions 200 by only the gate dielectric layer 230.

Figure 16:
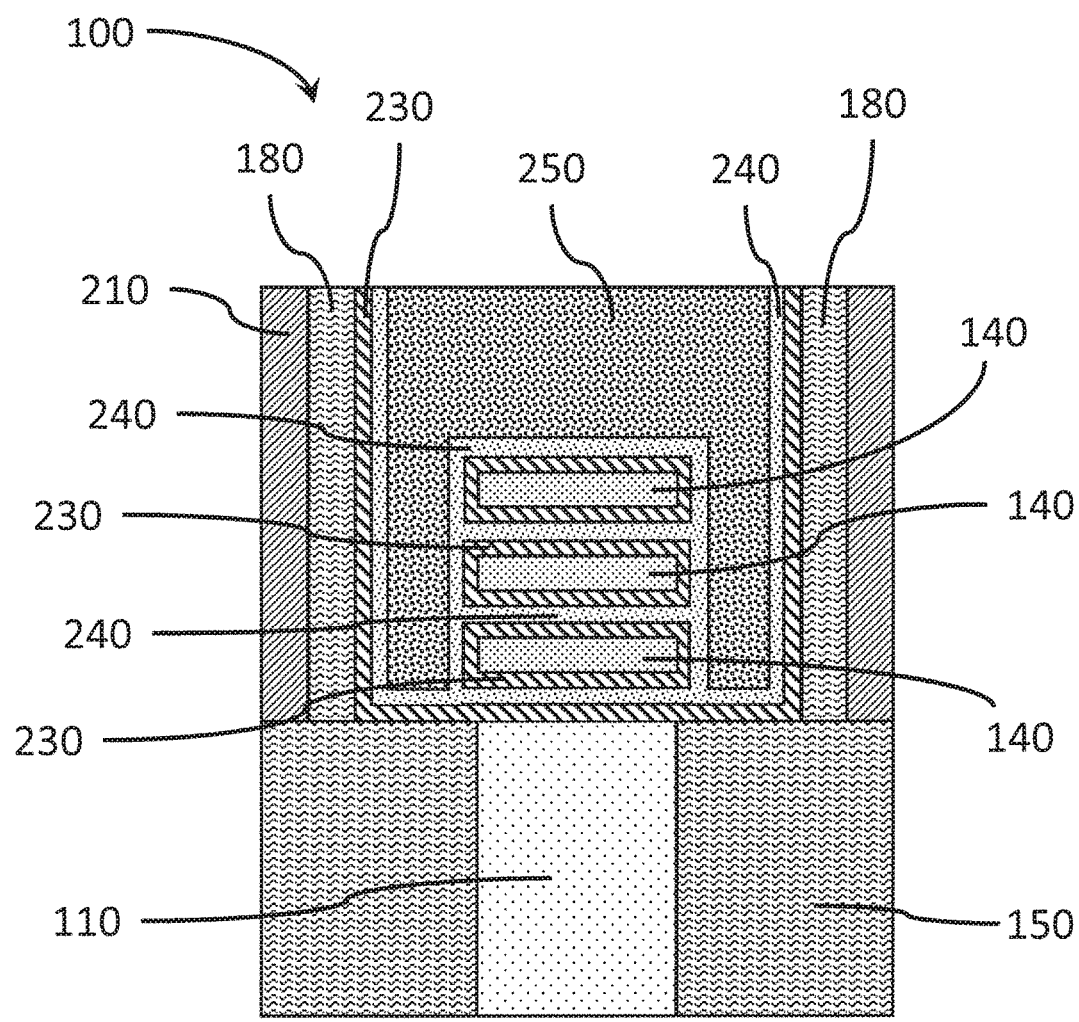
FIG. 16 is a cross-sectional view of a nanosheet device 100, looking across the channel layers and inside the gate, with a gate structure formed around each of the nanosheet channel layers, in accordance with an embodiment of the present invention.

FIG. 16 is a cross-sectional view of a nanosheet device 100, looking across the channel layers and inside the gate, with a gate structure formed around each of the nanosheet channel layers, in accordance with an embodiment of the present invention.

In one or more embodiments, the gate dielectric layer 230 and the work function layer 240 can wrap around each of the nanosheet channel layer(s) 140, and the gate fill layer 250 can surround the nanosheet channel layer(s) 140 and work function layer 240. The gate dielectric layer 230 can extend up the inside surface of the sidewall spacer 180, and the interlayer dielectric (ILD) 210 can be on the outside surface of the sidewall spacer 180.

In various embodiments, electrical contacts can be formed to the gate structure and source/drain regions 200.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It should be understood that use of descriptions such as top, bottom, left, right, vertical, horizontal, or the like, are intended to be in reference to the orientation(s) illustrated in the figures, and are intended to be descriptive and to distinguish aspects of depicted features without being limiting. Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Reference to first, second, third, etc., feature is intended to distinguish features without necessarily implying a particular order unless otherwise so stated or indicated. Thus, a first element discussed herein could be termed a second element without departing from the scope of the present concept.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment" of the present invention, as well as other variations thereof, means that a particular feature, structure, characteristic, and so forth described in connection with the embodiment is included in at least one embodiment of the present invention. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Having described preferred embodiments of a device and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method of forming a nanosheet device, comprising:
forming a channel stack on a substrate, where the channel stack includes at least one nanosheet channel layer and at least one sacrificial release layer;
forming a stack cover layer on at least a portion of the channel stack, wherein the stack cover layer is formed on at least a portion of exposed sides of the at least one nanosheet channel layer and the at least one sacrificial release layer;
forming a dummy gate on at least a portion of the stack cover layer, wherein at least a portion of the at least one nanosheet channel layer and at least one sacrificial release layer is exposed on opposite sides of the dummy gate;
removing at least a portion of the at least one sacrificial release layer on each side of the dummy gate to form a sacrificial supporting rib; and
forming an inner spacer layer on exposed portions of the at least one nanosheet channel layer and at least one sacrificial supporting rib.

2. The method of claim 1, wherein the one or more nanosheet channel layer(s) are silicon, and the sacrificial supporting rib includes a wider portion under the dummy gate.

3. The method of claim 1, further comprising removing a portion of the inner spacer layer, at least one nanosheet channel layer, and at least one sacrificial supporting rib from the opposite sides of the dummy gate, wherein removing the portion of the inner spacer layer leaves a rectangular cavity fill at each corner of the at least one nanosheet channel layer; and forming a source/drain region on opposite sides of the dummy gate.

4. The method of claim 3, wherein the source/drain region is epitaxially grown on a continuous sidewall formed by the at least one nanosheet channel layer and at least one sacrificial supporting rib.

5. The method of claim 3, further comprising removing the dummy gate; and removing at least a portion of the at least one sacrificial supporting rib.

6. The method of claim 5, further comprising forming a gate structure on the at least one nanosheet channel layer.

7. The method of claim 6, wherein the gate structure includes a gate dielectric layer wrapped around the at least one nanosheet channel layer.

8. The method of claim 6, wherein the gate structure includes a work function layer wrapped around the at least one nanosheet channel layer.

9. A method of forming a nanosheet device, comprising:
forming a channel stack on a substrate, where the channel stack includes at least one nanosheet channel layer and at least one sacrificial release layer;
forming a stack cover layer on at least a portion of the channel stack, wherein the stack cover layer is formed on at least a portion of exposed sides of the at least one nanosheet channel layer and the at least one sacrificial release layer;
forming a dummy gate on at least a portion of the stack cover layer, wherein at least a portion of the at least one nanosheet channel layer and at least one sacrificial release layer is exposed on opposite sides of the dummy gate;
removing at least a portion of the at least one sacrificial release layer on each side of the dummy gate to form a sacrificial supporting rib;
forming an inner spacer layer on exposed portions of the at least one nanosheet channel layer and at least one sacrificial supporting rib; and
removing the inner spacer layer, at least one nanosheet channel layer, and at least one sacrificial supporting rib from the opposite sides of the dummy gate to expose a portion of the substrate, wherein cavity fills remain under the dummy gate.

10. The method of claim 9, further comprising forming a source/drain region on opposite sides of the dummy gate, wherein the source/drain regions are epitaxially grown on a continuous sidewall formed by the at least one nanosheet channel layer and at least one sacrificial supporting rib.

11. The method of claim 9, wherein removing the inner spacer layer, at least one nanosheet channel layer, and at least one sacrificial supporting rib from the opposite sides of the dummy gate, exposes the cavity fills and end faces of the at least one nanosheet channel layer.

12. The method of claim 11, further comprising removing the dummy gate, wherein removing the dummy gate forms an opening that exposes the at least one nanosheet channel layer and at least one sacrificial supporting rib.

13. The method of claim 12, further comprising removing the at least one sacrificial supporting rib, and forming a gate dielectric layer wrapped around the at least one nanosheet channel layer.

14. The method of claim 13, wherein the gate dielectric layer is formed by atomic layer deposition (ALD).

* * * * *